United States Patent
Siau et al.

(10) Patent No.: US 8,270,193 B2
(45) Date of Patent: Sep. 18, 2012

(54) LOCAL BIT LINES AND METHODS OF SELECTING THE SAME TO ACCESS MEMORY ELEMENTS IN CROSS-POINT ARRAYS

(75) Inventors: Chang Hua Siau, San Jose, CA (US); Christophe Chevallier, Palo Alto, CA (US); Darrell Rinerson, Cupertino, CA (US); Seow Fong Lim, Fremont, CA (US); Sri Rama Namala, San Jose, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 231 days.

(21) Appl. No.: 12/657,911

(22) Filed: Jan. 29, 2010

(65) Prior Publication Data

US 2011/0188281 A1 Aug. 4, 2011

(51) Int. Cl.
*G11C 5/02* (2006.01)

(52) U.S. Cl. ............ 365/51; 365/63; 365/100; 365/148; 365/163; 365/186

(58) Field of Classification Search .................. 365/100, 365/148, 163, 186, 230.03, 51, 63
See application file for complete search history.

(56) References Cited

U.S. PATENT DOCUMENTS

| | | | |
|---|---|---|---|
| 5,483,482 A | 1/1996 | Yamada et al. | |
| 5,625,587 A | 4/1997 | Peng et al. | |
| 5,991,193 A | 11/1999 | Gallagher et al. | |
| 6,034,882 A | 3/2000 | Johnson et al. | |
| 6,128,214 A | 10/2000 | Kuekes et al. | |
| 6,185,122 B1 | 2/2001 | Johnson et al. | |
| 6,204,139 B1 | 3/2001 | Liu et al. | |
| 6,351,406 B1 | 2/2002 | Johnson et al. | |
| 6,385,074 B1 | 5/2002 | Johnson et al. | |
| 6,407,953 B1 | 6/2002 | Cleeves | |
| 6,420,215 B1 | 7/2002 | Knall et al. | |
| 6,459,095 B1 | 10/2002 | Heath et al. | |
| 6,473,332 B1 | 10/2002 | Ignatiev et al. | |
| 6,504,753 B1 | 1/2003 | Scheuerlein et al. | |
| 6,515,888 B2 | 2/2003 | Johnson et al. | |
| 6,515,904 B2 | 2/2003 | Moore et al. | |

(Continued)

OTHER PUBLICATIONS

U.S. Appl. No. 12/931,422, filed Jan. 31, 2011, Chevallier et al.

(Continued)

*Primary Examiner* — VanThu Nguyen
(74) *Attorney, Agent, or Firm* — Stolowitz Ford Cowger LLP

(57) ABSTRACT

Embodiments relate generally to semiconductors and memory technology, and more particularly, to systems, integrated circuits, and methods to implement a memory architecture that includes local bit lines for accessing subsets of memory elements, such as memory elements based on third dimensional memory technology. In at least some embodiments, an integrated circuit includes a cross-point memory array formed above a logic layer. The cross-point memory array includes X-lines and Y-lines, of which at least one Y-line includes groups of Y-line portions. Each of the Y-line portions can be arranged in parallel with other Y-line portions within a group of the Y-line portions. Also included are memory elements disposed between a subset of the X-lines and the group of the Y-line portions. In some embodiments, a decoder is configured to select a Y-line portion from the group of Y-line portions to access a subset of the memory elements.

23 Claims, 15 Drawing Sheets

U.S. PATENT DOCUMENTS

| | | |
|---|---|---|
| 6,522,594 B1 | 2/2003 | Scheuerlein |
| 6,525,953 B1 | 2/2003 | Johnson |
| 6,534,403 B2 | 3/2003 | Cleeves |
| 6,545,891 B1 | 4/2003 | Tringall et al. |
| 6,569,745 B2 | 5/2003 | Hsu |
| 6,599,796 B2 | 7/2003 | Mei et al. |
| 6,631,085 B2 | 10/2003 | Kleveland et al. |
| 6,642,539 B2 | 11/2003 | Ramesh et al. |
| 6,693,821 B2 | 2/2004 | Hsu et al. |
| 6,759,249 B2 | 7/2004 | Zhuang et al. |
| 6,777,248 B1 | 8/2004 | Nabatame et al. |
| 6,816,410 B2 | 11/2004 | Kleveland et al. |
| 6,822,903 B2 | 11/2004 | Scheuerlein et al. |
| 6,836,421 B2 | 12/2004 | Rinerson et al. |
| 6,850,455 B2 | 2/2005 | Rinerson et al. |
| 6,859,382 B2 | 2/2005 | Rinerson et al. |
| 6,882,553 B2 | 4/2005 | Nejad et al. |
| 6,917,539 B2 | 7/2005 | Rinerson et al. |
| 6,927,430 B2 | 8/2005 | Hsu |
| 6,937,505 B2 | 8/2005 | Morikawa |
| 6,940,113 B2 | 9/2005 | Hsu et al. |
| 6,940,744 B2 | 9/2005 | Rinerson et al. |
| 6,970,375 B2 | 11/2005 | Rinerson et al. |
| 7,001,846 B2 | 2/2006 | Hsu |
| 7,009,909 B2 | 3/2006 | Rinerson et al. |
| 7,020,006 B2 | 3/2006 | Chevallier et al. |
| 7,022,572 B2 | 4/2006 | Scheuerlein et al. |
| 7,023,743 B2 | 4/2006 | Nejad et al. |
| 7,046,550 B1 | 5/2006 | Reohr et al. |
| 7,057,914 B2 | 6/2006 | Rinerson et al. |
| 7,079,442 B2 | 7/2006 | Rinerson et al. |
| 7,141,481 B2 | 11/2006 | Hsu et al. |
| 7,177,181 B1 | 2/2007 | Scheuerlein |
| 7,256,415 B2 | 8/2007 | Furukawa et al. |
| 7,326,979 B2 | 2/2008 | Rinerson et al. |
| 7,339,811 B2 | 3/2008 | Nejad et al. |
| 7,372,753 B1 | 5/2008 | Rinerson et al. |
| 7,379,364 B2 | 5/2008 | Siau et al. |
| 7,394,680 B2 | 7/2008 | Toda et al. |
| 7,405,960 B2 | 7/2008 | Cho et al. |
| 7,411,811 B2* | 8/2008 | Inoue ................. 365/148 |
| 7,417,271 B2 | 8/2008 | Genrikh et al. |
| 7,443,711 B1 | 10/2008 | Stewart et al. |
| 7,463,546 B2 | 12/2008 | Fasoli et al. |
| 7,498,600 B2 | 3/2009 | Cho et al. |
| 7,505,344 B2 | 3/2009 | Scheuerlein |
| 7,508,695 B2 | 3/2009 | Sugita |
| 7,538,338 B2 | 5/2009 | Rinerson et al. |
| 7,608,467 B2 | 10/2009 | Wu et al. |
| 7,639,521 B2 | 12/2009 | Baek et al. |
| 7,643,344 B2 | 1/2010 | Choi |
| 7,701,791 B2 | 4/2010 | Rinerson et al. |
| 7,706,177 B2 | 4/2010 | Petti |
| 7,719,876 B2 | 5/2010 | Chevallier et al. |
| 7,733,685 B2 | 6/2010 | Scheuerlein et al. |
| 7,742,323 B2 | 6/2010 | Rinerson et al. |
| 7,782,650 B2 | 8/2010 | Bertin et al. |
| 7,842,991 B2 | 11/2010 | Cho et al. |
| 7,884,349 B2 | 2/2011 | Rinerson et al. |
| 7,898,841 B2 | 3/2011 | Chevallier et al. |
| 7,902,867 B2 | 3/2011 | Mouttet |
| 7,902,868 B2 | 3/2011 | Norman |
| 7,902,869 B1 | 3/2011 | Carter |
| 7,924,608 B2 | 4/2011 | Campbell |
| 7,929,345 B2 | 4/2011 | Issaq |
| 7,955,871 B2 | 6/2011 | Wu et al. |
| 7,961,494 B2 | 6/2011 | Scheuerlein |
| 7,983,065 B2* | 7/2011 | Samachisa ................. 365/51 |
| 7,985,963 B2 | 7/2011 | Rinerson et al. |
| 2001/0055838 A1 | 12/2001 | Walker et al. |
| 2003/0003675 A1 | 1/2003 | Hsu et al. |
| 2004/0109353 A1 | 6/2004 | Matsuoka |
| 2004/0170040 A1 | 9/2004 | Rinerson et al. |
| 2006/0054937 A1 | 3/2006 | Lucovsky et al. |
| 2006/0131695 A1 | 6/2006 | Kuekes et al. |
| 2006/0171200 A1 | 8/2006 | Rinerson et al. |
| 2008/0068875 A1 | 3/2008 | Choi |
| 2008/0090401 A1 | 4/2008 | Bratkovski et al. |
| 2008/0157127 A1 | 7/2008 | Bertin et al. |
| 2008/0278989 A1 | 11/2008 | Lee et al. |
| 2009/0027976 A1 | 1/2009 | Brewer et al. |
| 2009/0154232 A1 | 6/2009 | Norman |
| 2009/0225582 A1 | 9/2009 | Schloss |
| 2009/0302315 A1 | 12/2009 | Lee et al. |
| 2010/0044666 A1 | 2/2010 | Baek et al. |
| 2010/0067279 A1 | 3/2010 | Choi |
| 2010/0073990 A1 | 3/2010 | Siau et al. |
| 2010/0078759 A1 | 4/2010 | Sekar et al. |
| 2010/0103724 A1* | 4/2010 | Kim et al. ................. 365/163 |
| 2010/0110771 A1 | 5/2010 | Choi |
| 2010/0134239 A1 | 6/2010 | Wu et al. |
| 2010/0155686 A1 | 6/2010 | Bratkovski et al. |
| 2010/0155722 A1 | 6/2010 | Meyer |
| 2010/0157658 A1 | 6/2010 | Schloss et al. |
| 2010/0159641 A1 | 6/2010 | Rinerson et al. |
| 2010/0159688 A1 | 6/2010 | Rinerson et al. |
| 2010/0161888 A1 | 6/2010 | Eggleston |
| 2010/0195393 A1 | 8/2010 | Eggleston |
| 2010/0202188 A1 | 8/2010 | Rinerson et al. |
| 2010/0271885 A1 | 10/2010 | Scheuerlein et al. |
| 2010/0278479 A1 | 11/2010 | Bratkovski et al. |
| 2010/0290294 A1 | 11/2010 | Siau |
| 2011/0006275 A1 | 1/2011 | Roelofs et al. |
| 2011/0017977 A1 | 1/2011 | Bratkovski et al. |
| 2011/0024710 A1 | 2/2011 | Bratkovski et al. |
| 2011/0024716 A1 | 2/2011 | Bratkovski et al. |
| 2011/0059576 A1 | 3/2011 | Cho et al. |
| 2011/0297927 A1 | 12/2011 | Ramaswamy et al. |

OTHER PUBLICATIONS

U.S. Appl. No. 12/931,438, filed Feb. 1, 2011, Chevallier et al.
U.S. Appl. No. 12/657,895, filed Jan. 29, 2010, Chevallier et al.
U.S. Appl. No. 12/658,138, filed Feb. 2, 2010, Chevallier et al.
U.S. Appl. No. 13/134,579, filed Jun. 10, 2011, Chang Hua Siau et al.
U.S. Appl. No. 13/185,410, filed Jul. 18, 2011, Besser et al.
U.S. Appl. No. 13/210,292, filed Aug. 15, 2011, Bruce Bateman.
U.S. Appl. No. 13/250,923, filed Sep. 30, 2011, Jian Wu et al.
U.S. Appl. No. 13/250,772, filed Sep. 30, 2011, Louis Parrillo et al.
Elaine Ou et al., "Array Architecture for a Nonvolatile 3-Dimensional Cross-Point Resistance-Change Memory", IEEE Journal of Solid-State Circuits, vol. 46, No. 9, Sep. 2011, pp. 2158-2170.
Elaine Ou et al., "Array Architecture for a Nonvolatile 3-Dimensional Cross-Point Memory", Doctoral Dissertation, Stanford University, Mar. 2010, pp. 1-119.
Leon Abelmann et al., "Self-assembled three-dimensional non-volatile memories", Micromachines 2010, vol. 1, pp. 1-18, Jan. 18, 2010.
Ju. H. Krieger, "Principle Operation of 3-D Memory Device based on Piezoacousto Properties of Ferroelectric Films", InTech, Dec. 2010, pp. 3-16.
Ji Zhang et al., "A 3D RRAM Using Stackable 1TXR Memory Cell for High Density Application", IEEE Xplore, Feb. 5, 2010, pp. 917-920.
Yajie Dong et al., "Si/a-Si Core/Shell Nanowires as Nonvolatile Crossbar Switches", Nano Letters 2008, vol. 8, No. 2, pp. 386-391.
R Stanley Williams et al., "The switching location of a bipolar memristor: chemical, thermal and structural mapping", Nanotechnology 22 (2011) 254015, pp. 1-6.
D. L. Kwong et al., "Vertical Silicon Nanowire Platformfor Low Power Electronics and Clean Energy Applications", Journal of Nanotechnology, vol. 2012, Article ID 492121, pp. 1-21.
Jiyoung Kim et al., "Novel Vertical-Stacked-Array-Transistor (VSAT) for ultra-high-density and cost-effective NAND Flash memory devices and SSD (Solid State Drive)", 2009 Symposium on VLSI Technology Digest of Technical Papers, pp. 186-187.
Ryota Katsumata et al., "Pipe-shaped BiCS Flash Memory with 16 Stacked Layers and Multi-Level-Cell Operation for Ultra High Density Storage Devices", 2009 Symposium on VLSI Technology Digest of Technical Papers, pp. 136-137.
Christophe J. Chevallier et al., "A 0.13μm 64Mb Multi-Layered Conductive Metal-Oxide Memory" ISSCC 2010 / Session 14 / Non-Volatile Memory / 14.3, pp. 260-261.

Hong Sik Yoon et al., "Vertical Cross-point Resistance Change Memory for Ultra-High Density Non-volatile Memory Applications", 2009 Symposium on VLSI Technology Digest of Technical Papers, pp. 26-27.

Wonjoo Kim et al., "Multi-Layered Vertical Gate NAND Flash Overcoming Stacking Limit for Terabit Density Storage", 2009 Symposium on VLSI Technology Digest of Technical Papers, pp. 188-189.

I. G. Baek et al., "Realization of Vertical Resistive Memory (VRRAM) using cost effective 3D Process", IDEM 2011, 31.8.1, pp. 737-740.

Hang-Ting Lue et al., "A Highly Scalable 8-Layer 3D Vertical-Gate (VG) TFT NAND Flash Using Junction-Free Buried Channel BE-SONOS Device", IEEE 2010 Symposium on VLSI Technology Digest of Technical Papers, pp. 131-132.

Jaehoon Jang et al., "Vertical Cell Array using TCAT(Terabit Cell Array Transistor) Technology for Ultra High Density NAND Flash Memory", 2009 Symposium on VLSI Technology Digest of Technical Papers, pp. 192-193.

U.S. Appl. No. 12/653,854, filed Dec. 18, 2009, Bornstein et al.

U.S. Appl. No. 12/653,835, filed Dec. 18, 2009, Meyer.

U.S. Appl. No. 13/210,342, filed Aug. 15, 2011, Brewer et al.

* cited by examiner

LOCAL BIT LINES AND METHODS OF SELECTING THE SAME TO ACCESS MEMORY ELEMENTS IN CROSS-POINT ARRAYS

CROSS-REFERENCE TO RELATED APPLICATIONS

This application is related to U.S. patent application Ser. No. 11/095,026, filed Mar. 30, 2005, published as U.S. Pub. No. 20060171200, and entitled "Memory Using Mixed Valence Conductive Oxides," and to U.S. patent application Ser. No. 11/881,500, filed Sep. 11, 2008, published as U.S. Pub. No. 20090027977, and entitled "Low Read Current Architecture for Memory," both of which are incorporated herein by reference for all purposes.

FIELD OF THE INVENTION

Embodiments of the invention relate generally to semiconductors and memory technology, and more particularly, to systems, integrated circuits, and methods to implement a memory architecture that includes local bit lines for accessing subsets of memory elements, such as memory elements based on third dimensional memory technology.

BACKGROUND

Scaling the dimensions of memory arrays and cells typically affects operational characteristics of memory devices formed using specific memory technologies. In some memory technologies, a reduction in the size of array lines (e.g., word lines or bit lines) normally gives rise to reductions in the cross-sectional area of conductive paths, which, in turn, increase the resistivity of the array lines. The increased resistance of the array lines may produce a reduction of voltage (e.g., voltage drops) along those lines as a function of, for example, the amount of memory cells conducting current from the array lines. Scaled dimensions of memory arrays provide also for an increased number of memory cells per word line and/or bit line. Thus, the increased number of memory cells will increase the leakage current seen on array lines, further increasing the voltage drops on array lines. Further, the reduced dimensions (e.g., reduced pitch and other circuit features) and increased number of memory cells may exacerbate the difficulties in designing and/or laying out peripheral circuitry, such as a decoder or any other memory access-related circuit.

At least some conventional memory architectures, such as those including dynamic random access memory ("DRAM") technologies and Flash memory technologies, typically include non-ohmic devices as part of metal oxide semiconductor ("MOS") transistors or structures. A non-ohmic device is a circuit element that can block current from passing through a respective memory cell for certain parameters (e.g., during read operations) that might affect an unselected memory cell. Examples of non-ohmic devices include diodes and transistors, such as a MOS-based gate. Such gates operate to open and close conductive paths between the word lines (or bit lines) and the portions of the memory cells used as storage. When one of the conventional memory cells is unselected, its gate is in an "off" mode of operation and conducts negligible to no current. The gate structures used in conventional memory architectures typically buffer the conventional memory cells from the affects of possible leakage currents. The above-described memory architectures and technologies, while functional for their specific technologies, are not well suited to address the scaling of memory array dimensions and cell dimensions for other memory technologies.

It would be desirable to provide improved systems, integrated circuits, and methods that minimize one or more of the drawbacks associated with conventional techniques for facilitating memory operations in an improved memory architecture for resistive memory elements.

BRIEF DESCRIPTION OF THE DRAWINGS

The various embodiments are more fully appreciated in connection with the following detailed description taken in conjunction with the accompanying drawings, in which.

Like reference numerals refer to corresponding parts throughout the several views of the drawings. Note that most of the reference numerals include one or two left-most digits that generally identify the figure that first introduces that reference number.

DETAILED DESCRIPTION

Figure 1:
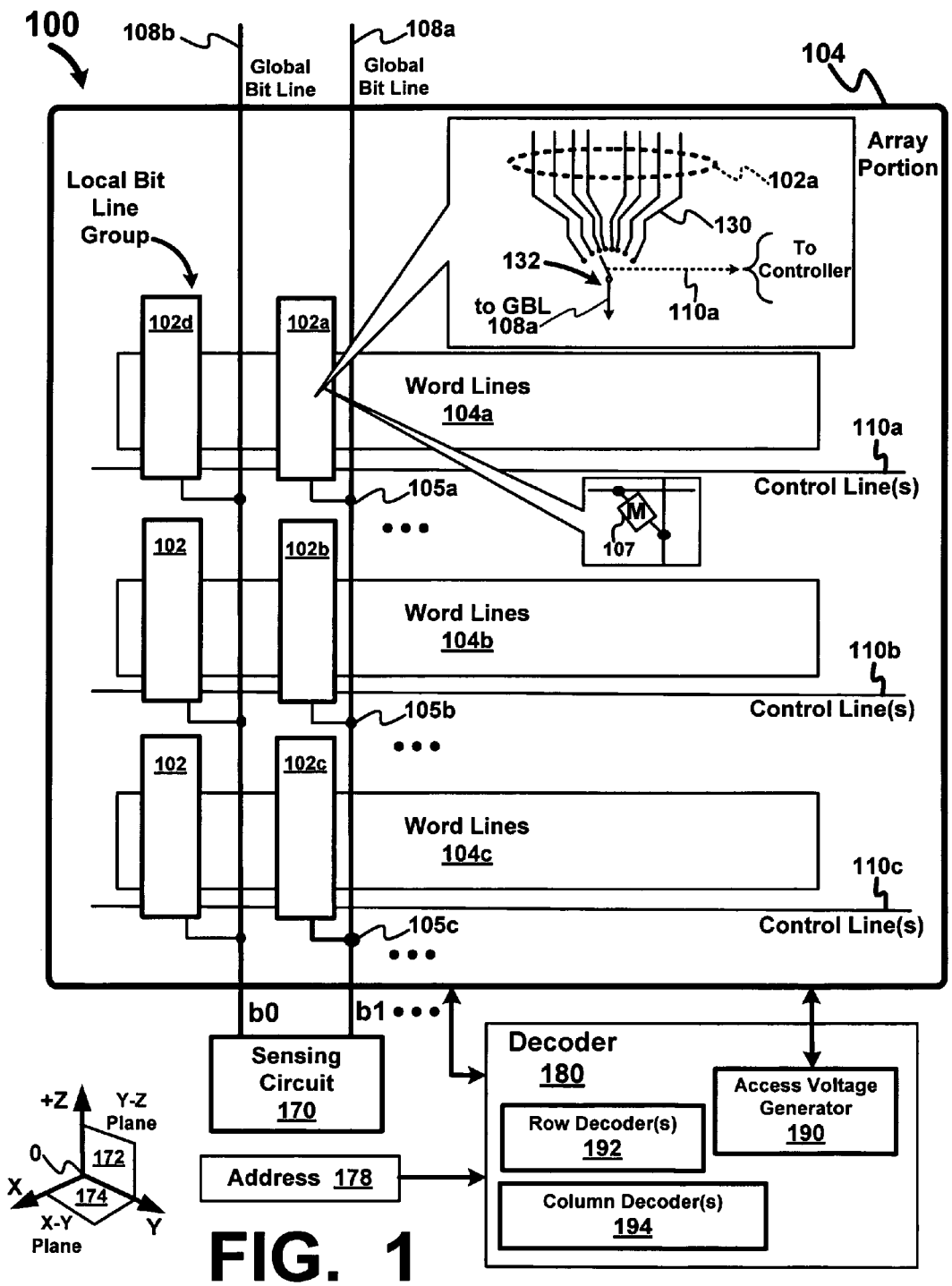
FIG. 1 depicts a memory array architecture in accordance with various embodiments of the invention.

Various embodiments or examples of the invention may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

U.S. patent application Ser. No. 11/095,026, filed Mar. 30, 2005, published as U.S. Pub. No. 20060171200, and entitled "Memory Using Mixed Valence Conductive Oxides," is hereby incorporated by reference in its entirety for all purposes and describes non-volatile third dimensional memory elements that may be arranged in a two-terminal, cross-point memory array. New memory structures are possible with the capability of this third dimensional memory array. In at least some embodiments, a two-terminal memory element or memory cell can be configured to change conductivity when exposed to an appropriate voltage drop across the two-terminals. The memory element can include an electrolytic tunnel barrier and a mixed valence conductive oxide in some embodiments, as well as multiple mixed valence conductive oxide structures in other embodiments. A voltage drop across the electrolytic tunnel barrier can cause an electrical field within the mixed valence conductive oxide that is strong enough to move oxygen ions out of a mixed valence conductive oxide, according to some embodiments.

In some embodiments, an electrolytic tunnel barrier and one or more mixed valence conductive oxide structures (e.g., one or more layers of a conductive oxide material) do not need to operate in a silicon substrate, and, therefore, can be fabricated above circuitry being used for other purposes. That is, the active circuitry portion can be fabricated front-end-of-the-line (FEOL) on a substrate (e.g., a Silicon—Si wafer or other semiconductor substrate) and one or more layers of two-terminal cross-point memory arrays that include the non-volatile memory elements can be fabricated back-end-of-the-line (BEOL) directly on top of the substrate and electrically coupled with the active circuitry in the FEOL layer using an inter-level interconnect structure also fabricated FEOL. Further, a two-terminal memory element can be arranged as a cross-point such that one terminal is electrically coupled with an X-direction line (or an "X-line") and the other terminal is electrically coupled with a Y-direction line (or a "Y-line"). A third dimensional memory can include multiple memory elements vertically stacked upon one another, sometimes sharing X-direction and Y-direction lines in a layer of memory, and sometimes having isolated lines. When a first write voltage, VW1, is applied across the memory element (e.g., by applying ½ VW1 to the X-direction line and ½-VW1 to the Y-direction line), the memory element can switch to a low resistive state. When a second write voltage, VW2, is applied across the memory element (e.g., by applying ½ VW2 to the X-direction line and ½-VW2 to the Y-direction line), the memory element can switch to a high resistive state. Memory elements using electrolytic tunnel barriers and mixed valence conductive oxides can have VW1 opposite in polarity from VW2.

FIG. 1 depicts an example of one of the memory array architectures in accordance with various embodiments of the invention. In this example, diagram 100 depicts an array portion 104 that includes an arrangement of word lines 104 and global bit lines 108. As shown, global bit lines 108 include groups 102 of bit line portions, with individual groups 102a of bit line portions including a number of bit line portions 130 arranged in parallel (e.g., electrically in parallel) with each other. Any of bit line portions 130 can be selectable to provide a conductive path to a respective global bit line ("GBL") 108. In some embodiments, group 102a of bit line portions, group 102b of bit line portions, and group 102c of bit line portions can be configured to couple to points 105a, 105b, and 105c, respectively, of global bit line 108a. In some embodiments, points 105a, 105b, and 105c can be located at equivalent distances along global bit line 108a based on, for example, the number of memory elements in individual groups 102 of bit line portions. In some embodiments, word lines 104 are partitioned into groups, such as word line group 104a, word line group 104b, and word line group 104c, with memory elements being disposed between a subset of word lines 104 (e.g., word lines in word line group 104a) and a group 102 of bit line portions (e.g., group 102a). A switching structure 132 is operable to electrically couple any bit line portion 130 in group 102a with global bit line 108a for accessing a memory element in a memory access operation. A selected memory element can be coupled between one of bit line portions 130 and a word line (e.g., such as a word line in word lines group 104a). An example of switching structure 132 is a MOS transistor configured to operate as a pass gate. Array portion 104 also includes control lines 110, such as control lines 110a to 110c, that are configured to provide groups 102 of bit line portions with one or more control signals to select a bit line portion, such as bit line portion 130.

In view of the foregoing, the structures and/or functionalities of the memory array architecture can facilitate the scaling of dimensions and size of array portion 104 and its elements to accommodate a greater quantity of memory elements, according to various embodiments. In various embodiments, a memory element ("M") 107 is a two-terminal memory element configured to maintain a state (e.g., a resistive state) representative of a data stored therein. In particular, a two-terminal memory element 107 can have a programmable resistivity to store a logical state (i.e., two or more logical states) or data value as a value of resistance. In some examples, memory element 107 can exclude a non-ohmic device that might otherwise regulate current flow when memory element 107 is in an unselected state that can provide for a conductive path in an unselected state. Omission of a non-ohmic device can facilitate a reduction in the magnitude of voltage levels that are used to perform read, program, and erase operations, according to some embodiments.

Further, the structures and/or functionalities of the memory array architecture in accordance with the various embodiments can reduce currents that otherwise might be generated by unselected memory elements. As an example, consider that an access signal that otherwise might be applied to a global bit line 108 to access a memory element is applied to a group 102 of bit line portions. Therefore, the access signal need not be applied to other memory elements (e.g., unselected memory elements) via other groups 102 of bit line portions, thereby reducing the quantity of memory elements that might otherwise conduct current (e.g., as leakage current). The term "access signal" can refer to, at least in some embodiments, a select voltage signal that can be a read voltage or a write voltage.

In some embodiments, memory element 107 is a resistive state memory element having a non-linear resistivity as a function of a potential difference across its terminals. In an unselected state, memory element 107 conducts less current than a memory element that behaves linearly (i.e., a linear memory element that generates a linear current as a function of voltage) for an equivalent potential difference. As non-linear memory element 107 conducts less current than a linear memory element, more unselected non-linear memory elements can be implemented in a bit line portion 130 than unselected linear memory elements for equivalent leakage currents. Therefore, a bit line portion 130 can include an amount of memory elements 107 determined as a function of a non-linear resistivity for the memory elements.

According to various embodiments, the structures and/or functionalities of a memory array architecture, including array portion 104 can facilitate array efficiency and a reduction in die size. In various embodiments, word lines groups 104, groups 102 of bit line portions, and the memory elements can be disposed within one or more layers (e.g., one or more layers of memory) in array portion 104. In at least some embodiments, one or more layers of memory are formed upon a logic layer, which, in turn, is formed on a semiconductor substrate. In some embodiments, one or more bit line portions in groups 102 of bit line portions can extend through two or more layers of memory. For example, consider that the word lines groups 104 and global bit lines 108 are disposed in or parallel to (or substantially parallel to) an X-Y plane 174. Therefore, the bit line portions of groups 102 can be disposed in a Y-Z plane 172 that is oriented perpendicular (or substantially perpendicular to) the substrate (not shown). For example, multiple portions of bit line portions 130 (i.e., the portions that couple to the memory elements) are formed in multiple memory layers in the Z-direction (e.g., along a +Z axis) over a substrate oriented in X-Y plane 174. The multiple memory layers are vertically stacked over one another and are fabricated BEOL directly over the substrate and tin contact with the substrate. Circuitry (e.g., sense amps, muxes, address decoders, read and write voltage sources, and the like) for accessing the multiple memory layers is fabricated FEOL on the substrate (e.g., CMOS circuitry fabricated on a Silicon—Si wafer). In some applications, only a single layer of memory can be fabricated BEOL over the substrate.

In some embodiments, switching structure 132 and other similar switching structures for other groups 102 of bit line groups can be situated at layers different than a layer at which memory elements reside. For example, switching structure 132 and control lines 110 can be formed in a logic layer located below one or more memory layers that include memory elements 107, thereby conserving area and/or resources that otherwise might increase die size. In various embodiments, other periphery circuitry can reside underneath array portion 104 (and/or an array composed of array portion 104) to further conserve area and/or resources of array portion 104. For example, a decoder 180 (or portions thereof) can be disposed partially or substantially (e.g., entirely or nearly entirely) below layers of memory elements. Decoder 180 can be configured to decode an address 178 to select a word line in any of word line groups 104a, 104b, and 104c, and to select a bit line portion in one of groups 102 to perform a memory operation. Other peripheral circuits, such as sensing circuits 170, can be disposed partially or entirely under the layers of memory composed of array portion 104. In some embodiments, periphery circuitry, such as switching structure 132, control lines 110, and decoder 180, can be formed in a logic layer on a substrate using complementary metal-oxide-semiconductor ("CMOS") fabrication processes, including relatively low voltage CMOS fabrications processes (e.g., to fabricate low voltage CMOS fabrication devices operable with gate voltages of 1.2 volts or less).

Decoder 180 can include one or more row decoders 192 and/or one or more column decoders 194, according to some embodiments. Decoder 180 is configured to receive and decode address 178 to determine which selected memory element is selected to apply at least an access signal voltage. A row decoder 192 is configured to receive a portion of address 178 and to decode the address portion to select one of a number word lines (i.e., one of a number of rows). For example, row decoder 192 can determine a word line to apply an access signal voltage within one of word line groups 104a, 104b, and 104c. A column decoder 194 is configured to receive another portion of address 178 and to decode this other address portion to select one of a number word lines global bit lines 108 (e.g., one of a number of columns). In particular, column decoder 194 can determine a specific group 102 of bit line portions for which to apply an access signal voltage. This, in turn, also can determine which of word line groups 104a, 104b, and 104c is to be selected. For example, column decoder 194 can select group 102b of bit line portions to access, thereby determining that row decoder 192 is to access a word line in word line group 104b. Further, column decoder 194 can generate a control signal applied to one of control lines 110b for selecting one of bit line portions in group 102b. Once a memory element is selected, access voltage generator 190 can generate one or more access signal voltages to apply via a selected word line and a selected bit line portion to perform a read operation or a write operation (i.e., a write operation to program or erase). Upon accessing the selected memory element in, for example, a read operation, the selected memory element generates a read signal (e.g., a read current) representative of a resistive state (i.e., a logical value) and a switching structure 132 associated with group 102b gates the read signal onto global bit line 108a as bit, "b1." Sensing circuit 170 can include sense amplifiers and related circuitry to receive the read signal and to determine the logical state stored in the memory element.

Access voltage generator 190 is configured to generate select voltage signals for performing read and write operations for application to word lines and bit line portions, and, optionally, non-selected voltage signals, according to some embodiments. For example, an access voltage generator 190 can be configured to apply a first access voltage to a selected word line and apply a second access voltage to a group of bit line portions 130 for generating a potential difference across a selected resistive memory element in a group of memory elements. To program a logical value stored in the selected memory element, access voltage generator 190 is configured to apply a positive potential difference from a selected one of the bit line portions to the selected word line (i.e., the positive polarity being relative to the bit line portion). To erase a logical value stored in the selected memory element, access voltage generator 190 is configured to apply a negative potential difference from the selected one of the bit line portions to the selected word line (i.e., the negative polarity being relative to the bit line portion). In some embodiments the polarities to program and erase may be reversed. In some embodiments, the magnitude of the potential difference is 4 volts or less. The first access voltage and the second access voltage can be the same magnitudes (but different polarities) or can be different. For example, the first access voltage and the second access voltage can be approximately +2 volts and approximately −2 volts, respectively, as applied to the selected word line and to the selected bit line portion 130 to program the selected memory element. As another example, the first access voltage and the second access voltage can be voltages of approximately −2 volts and approximately +2 volts, respectively, as applied to the selected word line and to the selected bit line portion 130 to erase the selected memory element.

As to read, operations, access voltage generator 190 is configured to generate select voltage signals for accessing a selected memory element to read out one or more logical values, according to some embodiments. For example, access voltage generator 190 can generate a select voltage signal sufficient to generate a read current by the selected memory cell. In some embodiments, access voltage generator 190 is configured also to generate non-select voltage signals to apply to unselected word lines and/or bit line portions. Further, access voltage generator 190 can generate pre-charge voltage signals for use during memory access operations, according to at least some embodiments. Access voltage generator 190 also can generate control signal voltages of different magnitudes for application to switching structure 132.

Array portion 104 can be formed as part of a cross-point array, according to some embodiments. As one example, the array portion 104 can be at least one two-terminal cross-point memory array including a plurality of two-terminal memory elements, a plurality of word lines, and a plurality of bit lines. Each memory element (e.g., memory element 107) having a first terminal electrically coupled with only one of the plurality of word lines and a second terminal electrically coupled with only one of the plurality of bit lines. Memory elements 107 in the cross-point array are positioned at an intersection of a word line and a bit line portion. Further, a cross-point array can be a single layer of memory cells or a stacked cross-point array that includes multiple layers of memory cells that are vertically stacked upon one another. For example, the multiple layers can be vertically stacked along the Z-axis (e.g., the +Z axis). In some embodiments, the term "word line" can be used interchangeably with the term "X-line" and the term "bit line" and "bit line portion" can be used interchangeably with the term "Y-line." In various other embodiments, array portion 104 can be structured as other than a cross-point array, and/or can include memory elements that are either three-terminal memory elements or are other than resistive-state memory elements, or both.

Figure 2A:
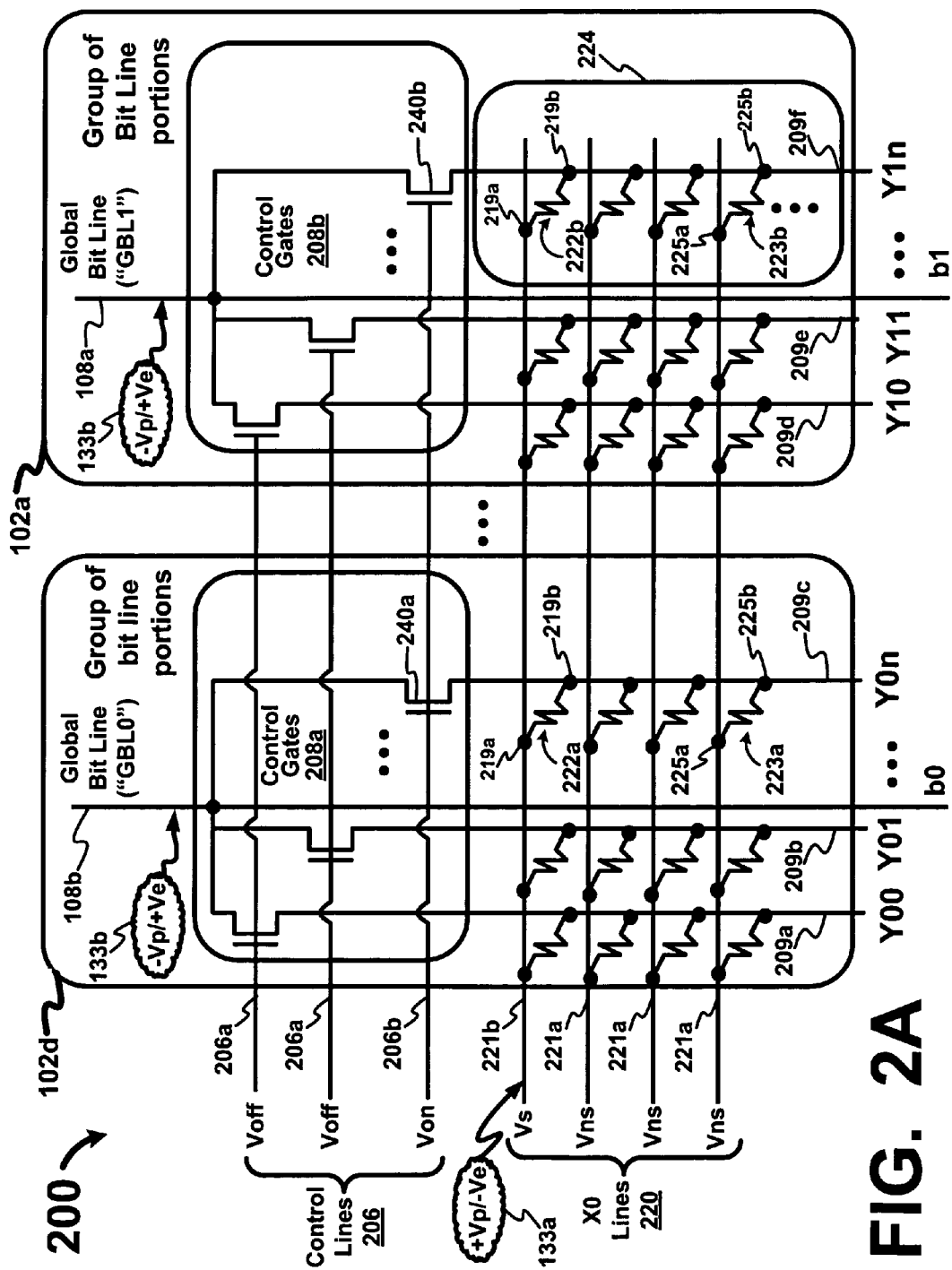
FIG. 2A depicts examples of bit line portions for memory architectures in accordance with various embodiments of the invention.

FIG. 2A depicts examples of bit line portions for memory architectures in accordance with various embodiments of the invention. Diagram 200 depicts groups 102*d* and 102*a* of bit line portions in FIG. 1 using resistive memory elements, according to some embodiments. As shown, group 102*d* of bit line portions includes control gates 208*a* as switching structures and a number of bit line portions 209*a* to 209*c*, such as bit line portions "Y00," "Y01," and "Y0n," where "Y0" denotes bit line portions associated with global bit line ("GBL0") 108*b*. Similarly, group 102*a* of bit line portions includes control gates 208*b* as switching structures and a number of bit line portions 209*d* to 209*f*, such as bit line portions "Y10," "Y11," and "Y1n," where "Y1" denotes bit line portions associated with global bit line ("GBL1") 108*a*. Bit line portion 209*f* illustrates a grouping 224 of memory elements that can include any number of memory elements. A number of control lines 206 are coupled to control gates 208*a* and 208*b* to select which one of bit line portions 209*a* to 209*c* and bit line portions 209*d* to 209*f*, respectively, are gated to global bit lines 108*b* and 108*a*. A number of word lines ("X0 lines") 220 are coupled via memory elements to bit line portions 209*a* to 209*f* in groups 102*d* and 102*a*. Note that while the memory elements are depicted as resistive memory elements, the memory elements need not be limited to resistive memory elements, according to alternate embodiments.

To illustrate operation of groups 102*d* and 102*a* of bit line portions, consider that memory elements 222*a* and 222*b* are targeted for access during a read operation. During a read operation, consider that a read voltage—as a select voltage ("Vs") signal—is applied to word line 221*b* to apply the read voltage signal to the terminals 219*a* of memory elements 222*a* and 222*b*. An activation signal ("Von") is applied to control line 206*b* to activate control gates 240*a* and 240*b* for coupling terminals 219*b* of memory elements 222*a* and 222*b* to respective global bit lines 108*b* and 108*a*. In particular, activation of control gates 240*a* and 240*b* provides for conductive paths to convey read currents (or voltages) from memory elements 222*a* and 222*b* via bit line portions 209*c* and 209*f* to global bit lines 108*b* and 108*a*, respectively. A deactivation signal ("Voff") is applied to control lines 206*a* to deactivate control gates (other than 240*a* and 240*b*), thereby decoupling bit line portions 209*a* and 209*b* from global bit line 108*b* and decoupling bit line portions 209*d* and 209*e* from global bit line 108*a*. Memory elements 222*a* and 222*b* can be referred to as "selected" memory elements as they are selected for a particular memory operation. In various embodiments, a select voltage ("Vs") signal can be a voltage signal of any magnitude and any polarity suitable to generate detectable read currents representative of two or more resistive states for each bit (e.g., for each bit b0 and bit b1). The two or more resistive states are associated with stored logical values (e.g., logical values of 0 or 1; or logical values of 00, 01, 10, or 11, etc.). An example of a select voltage signal is approximately 1.5 volts. In some embodiments, a non-select voltage ("Vns") signal is applied to word lines 221*a* that are not coupled to memory elements subject to the read operation. For example, a non-select voltage ("Vns") signal can be applied to terminals 225*a* of respective memory elements 223*a* and 223*b*, both of which can be referred to as "unselected" memory elements. An example of a non-select voltage signal includes a voltage signal of approximately 0 volts during the read operation.

To illustrate further operation of groups 102*d* and 102*a* of bit line portions, consider that memory elements 222*a* and 222*b* are targeted for access during a write operation. During a programming operation, consider that a positive programming voltage ("+Vp") 133*a*—as a select voltage ("Vs") signal—is applied via word line 221*b* to the terminals 219*a* of memory elements 222*a* and 222*b*, and a negative programming voltage ("−Vp") 133*b*—as a select voltage signal—is applied via global bit lines 108*b* and 108*a* to the terminals 219*b* of respective memory elements 222*a* and 222*b*. As such, a positive potential difference between global bit lines 108*b* or 108*a* and word line 221*b* (relative to global bit lines 108*b* or 108*a*) is applied across memory elements 222*a* and 222*b* of sufficient magnitude to configure the resistive states to reflect a programmed state. Therefore, the positive potential difference provides for a programming voltage across memory elements, such as selected memory element 222*a* and 222*b* at the intersection of word line 221*b* and bit line portions 209*c* and 209*f*. In some embodiments, a program current of approximately one microampere can be sufficient to program selected memory element 222*a* and 222*b*. A magnitude less than the positive potential difference (e.g., one-half programming voltage) can be applied as a partial programming voltage across other memory elements having at least one terminal coupled to bit line portions 209*c* and 209*f*, such as unselected memory elements 223*a* and 223*b*. In particular, terminals 225*b* of unselected memory elements 223*a* and 223*b* receive select voltage signals, whereas the terminals 225*a* do not receive select voltage signals. As unselected memory elements 223*a* and 223*b* receive select voltage signals at terminals 225*b*, these memory elements can also be referred to as "half-selected" memory elements as they are subject to partial programming (or erasing) voltages. Memory elements that have none of their terminals coupled to either word line 221*b* or one of bit line portions 209*c* and 209*f* can also be referred to as "unselected memory elements" and are not subject to the programming voltage or the partial programming voltage. During an erase operation, an erase voltage of inverse polarity (relative to the program voltage) is used. That is, a negative erasing voltage ("−Ve") 133*a*—as a select voltage ("Vs") signal—is applied via word line 221b to the terminals 219a of memory elements 222a and 222b, and a positive erase voltage ("+Ve") 133b—as a select voltage signal—is applied via global bit lines 108b and 108a to the terminals 219b of respective memory elements 222a and 222b. As such, a negative potential difference between global bit lines 108b or 108a and word line 221b (relative to global bit lines 108b or 108a) is applied across memory elements 222a and 222b of sufficient magnitude to configure the resistive states to reflect an erased state. Partial erasing voltages can be applied to unselected memory elements 223a and 223b as terminals 225b are coupled to bit line portions 209c and 209f. Memory elements that do not have a terminal coupled to bit line portions 209c and 209f are not subject to the erasing voltage or the partial erasing voltage.

In various embodiments, values of programming voltages +Vp and −Vp can be the same or different. In one example, values of programming voltages +Vp and −Vp can be +2 volts and −2 volts, respectively, to generate a positive potential difference of +4 volts across memory element 222a and 222b relative to global bit lines 108b and 108a. In other examples, values of programming voltages +Vp and −Vp can be +2 volts and −1 volt, or +3 volts and 0 volts, respectively, to generate a positive potential difference of +3 volts across memory element 222a and 222b relative to global bit lines 108b and 108a. Similarly, values of erasing voltages −Ve and +Vp can be the same or different and can have magnitudes as described above for programming voltages, with reverse polarities.

A non-select voltage ("Vns") signal is applied to word lines 221a that are not coupled to memory elements subject to a write operation, according to various embodiments. During a programming operation, for example, a non-select voltage ("Vns") signal can be applied to terminals 225a of memory elements 223a and 223b, both of which can be referred to as "unselected" memory elements during the programming operation. An example of a non-select voltage signal is approximately 0 volts. In some embodiments, the non-select voltage signal applied to word lines 221a can be a non-zero voltage value, such as an amount that is less than (e.g., a fraction of) the select voltage signal magnitude that is applied to word line 221b. For example, consider that for a programming voltage of +2.0 volts that is applied to word line 221b as select voltage signal 133a, +Vp, a corresponding non-select voltage signal, Vns, can be applied to word lines 221a. In some cases, non-select voltage signal can be 0.5 volts (or any other suitable value). During an erase operation, for example, the non-select voltage signal applied to word lines 221a can also be a non-zero value less than the voltage signal magnitude that is applied to word line 221b. For instance, consider that for an erasing voltage of −2.0 volts that is applied to word line 221b as select voltage signal 133a, −Ve, a corresponding non-select voltage signal, Vns, can be applied to word lines 221a. In some cases, non-select voltage signal can be −0.5 volts (or any other suitable value). Note that in alternative embodiments, word lines 221a and 222b can be disconnected and configured to float if memory elements associated with the number of word lines ("X0 lines") 220 are not selected (or are unselected). For instance, when global bit lines 108b and 108a are going to receive read current from other memory elements not shown in FIG. 2A (i.e., none of word lines 221a and 221b are selected), then word lines 221a and 221b can be set to zero volts (0V) or can be set to float.

As used herein, a memory element is in a "selected memory element" when it is selected for access during a memory access operation, and two or more of its terminals are configured to facilitate either a read or write operation. During read operations, a selected memory element has a terminal coupled to a select voltage signal (e.g., a read voltage) and another terminal coupled to a global bit line. During write operations, a selected memory element has a terminal coupled to receive a first programming (or erase) voltage and has another terminal coupled to receive a second programming (or erase) voltage. A selected memory element can be described as being in a "selected state" during a memory access operation. As used herein, a memory element is in an "unselected memory element" when it is not selected for access during a memory access operation, and one or none of its terminals are configured to facilitate either a read or write operation. In one instance, a single terminal of an unselected memory element can be configured to facilitate either a read or write operation. As such, an unselected memory element during a read operation has one terminal coupled to a global bit line and another terminal coupled to an unselected word line. During a write operation, one terminal is coupled to receive a programming (or erase) voltage and another terminal is not. In this case, the unselected memory element can also be referred to as a "half-selected" memory element. In another instance, when none of the terminals are coupled to a global bit line during a read operation or to receive a programming (or erase) voltage, the memory element can also be described as an unselected memory element. An unselected memory element can be described as being in an "unselected state" during a memory access operation.

In various embodiments, control gates 208a and 208b can be configured to operate as pass gates. For example, control gates 208a and 208b can include MOS-based pass gates. Therefore, control gates 208a and 208b each can be implemented as a Y-line gate (e.g., a Y-line MOS pass gate) being coupled between a Y-line (e.g., a global bit line 108) and a Y-line portion (e.g., a bit line portion 209). In some embodiments, the term "bit line portion" can be used interchangeably with the term "local bit line." In some embodiments, a decoder, such as decoder 180 of FIG. 1, can be configured to activate a Y-line gate to couple a local Y-line portion to a Y-line, and can deactivate other Y-line gates to decouple other Y-line portions in a group of Y-line portions from the Y-line. In some embodiments, control gates 208a and 208b can be disposed in a logic layer between a layer of memory and a substrate. Further, memory elements associated with bit line portions 209a to 209f can be disposed in multiple layers of memory.

Figure 2B:
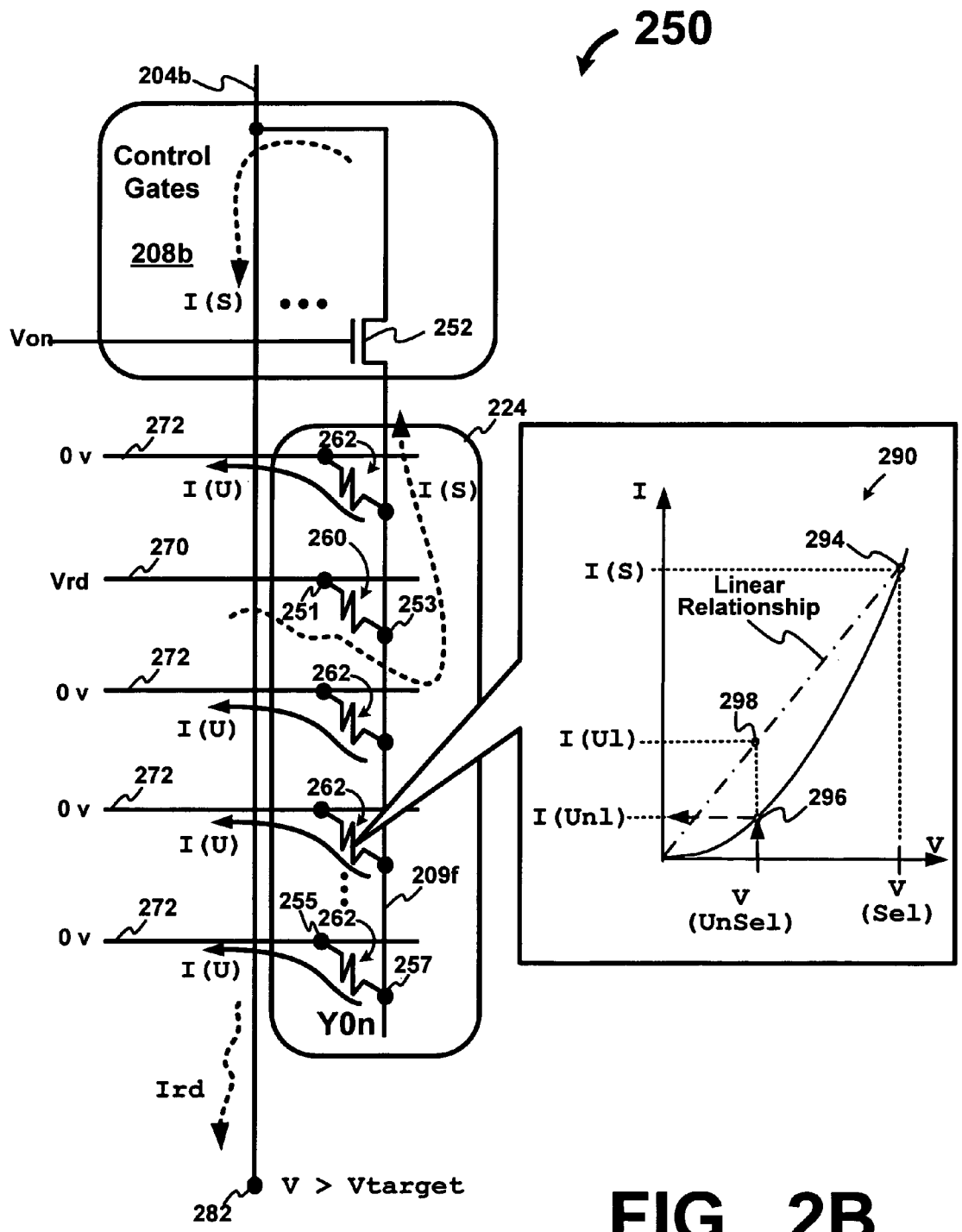
FIG. 2B depicts an example of a bit line portion and a quantity of memory elements as a function of a non-linearity characteristic of a resistive memory element in accordance with various embodiments of the invention.

FIG. 2B depicts an example of a bit line portion and a quantity of memory elements as a function of a non-linearity characteristic of a resistive memory element in accordance with various embodiments of the invention. Diagram 250 depicts a grouping of memory elements 224 coupled between bit line portion 209f and word lines 270 and 272, the quantity of memory elements 260 and 262 in grouping 224 being determined as a function of the relationship between current and an applied voltage. Diagram 250 also shows a pass gate 252 in a group of control gates 208b of FIG. 2A that is configured to couple bit line portion 209f to global bit line 204b in this example. During a read operation, a select voltage signal (i.e., a read voltage, "Vrd") is applied to word line 270 and non-select voltage signals (e.g., zero voltage) are applied to word lines 272. In this configuration, memory element 260 is in a selected state and memory elements 262 are each in an unselected state. In response to the application of Vrd, selected memory element 260 generates a selected current, "I(S)," as an access current (e.g., a read current) from terminal 251 to terminal 253. The selected current, I(S), then flows from terminal 253 onto bit line portion 209f. By contrast, unselected memory elements 262 generate unselected currents, "I(U)," from terminals 257 to terminals 255. As used herein, the term "unselected current" can refer, at least in some embodiments, to a leakage current produced by an unselected memory element (i.e., a half-selected memory element) during, for example, a read operation.

In some embodiments, memory elements 260 and 262 exhibit non-linear operational characteristics. For example, a memory element can generate non-linear amounts of current responsive to voltages applied to the memory element. As shown in relationship 290, a selected memory element 260 can generate a selected current, I(S), having a current value 294, whereas an unselected memory element 262 can generate an unselected non-linear current, I(UnI), having a current value 296. Therefore, a memory element in grouping 224 is configured to conduct a current 294 when a potential difference, V(sel), is applied across its terminals (e.g., terminals 251 and 253), and conduct a current 296 when another potential difference, V(UnSel), is applied across it terminals (e.g., terminals 257 and 255). As depicted in relationship 290, the magnitudes of current value 294 and current value 296 are related non-linearly to the potential difference, V(Sel), and the other potential difference, V(UnSel), respectively. Note further that memory elements 260 and 262—as non-linear resistive elements—generate less leakage currents than linear resistive elements. A linear resistive memory element (not shown) typically generates a current value ("I(UI)") 298 for the potential difference, V(UnSel). As shown, an unselected linear memory element generates more leakage current than an unselected non-linear memory element. Therefore, grouping 224 can include more non-linear memory elements than linear memory elements for an equivalent amount of collective leakage current. In view of the foregoing, an amount of memory elements 260 and 262 can be determined as a function of the non-linear resistivity for each of the memory elements.

In at least one embodiment, the amount of memory elements is determined so that a read current, Ird, applied to terminal 282 (e.g., an input terminal to a sensing circuit) generates a target voltage, "Vtarget," which is sufficient for detecting logical values stored in memory element 260. Thus, memory element 260 is configured to transmit the selected current, I(S), via pass gate 252 to establish a voltage, V, on global bit line 204b that is not less than the target voltage, "Vtarget." The application of the selected current to the global bit line 204b is offset by the collect leakage currents generated by the number of resistive memory elements 262, which operation to draw current via pass gate 252 from global bit line 204b, thereby reducing the magnitude of the voltage, V. As such, the quantity of memory elements in grouping 224 is based on the number of unselected resistive memory elements 262 that collectively conduct an amount of the leakage current that maintains the voltage, V, at or above the target voltage. In particular, the quantity of memory elements in grouping 224 can be determined to ensure that current, I(S), offsets the collective leakage currents, I(U), so as to maintain the target voltage at terminal 282. In some embodiments, the target voltage is in a range of 100 mV to 200 mV. In at least one embodiment, the quantity of memory elements in grouping 224 is approximately 1,000 for a target voltage at, for example, 200 mV. In some cases, the amount of memory elements can be based on a ratio between a current for a selected memory element (e.g., I(S)) and a current (e.g., a collective current) for one or more unselected memory elements. Note that in at least some cases, a read current can be an amount of selected current less (or minus) an amount of aggregate leakage current. In some embodiments, one or more unselected memory element 262 can be configured to generate a leakage current of a few nanoamperes.

Figure 3:
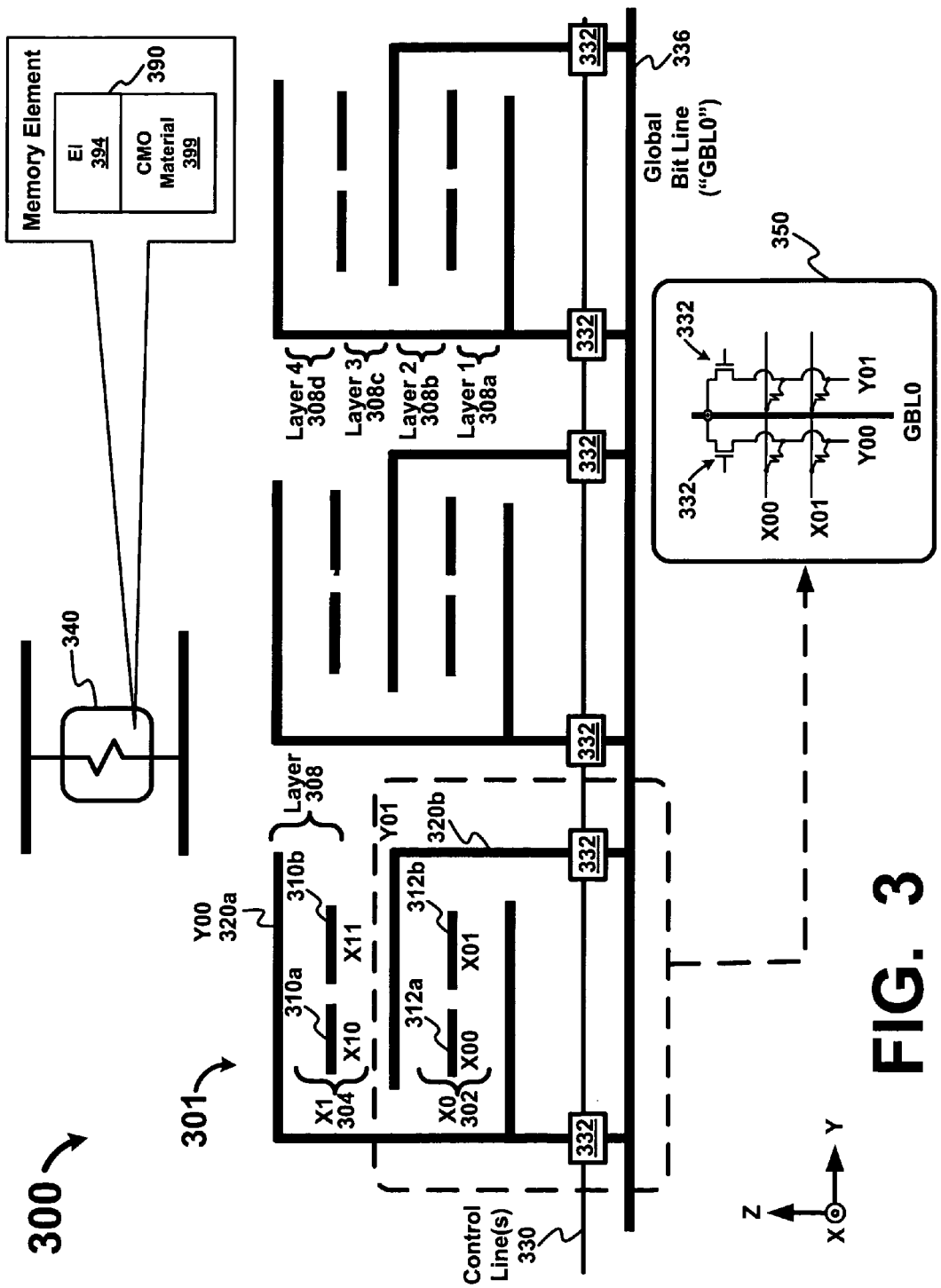
FIG. 3 depicts a diagram illustrating an example of a memory array architecture for portions of a Y-line in accordance with embodiments of the invention.

FIG. 3 is a diagram depicting one example of an architecture for a memory array for portions of a Y-line in accordance with embodiments of the invention. Diagram 300 depicts array portions 301 each including a global bit line ("GBL0") 336 (or a portion thereof), a number of X-lines 310 and 312 arranged in one orientation, and a number of Y-line portions 320 arranged in another orientation. In particular, global bit line 336 and X-lines 310 and 312 lie in planes parallel to an X-Y plane, and Y-line portions 320 lie in a plane parallel to a Z-Y plane (i.e., perpendicular to the X-Y plane). As shown, Y-line portions 320 extend from global bit line 336 into two or more layers 308 of memory and are coupled via control gates 332 to global bit line 336. In the example shown, array portions 301 include four layers 308 including from layer ("layer 1") 308a to layer ("layer 4") 308d, whereby each layer is a layer of memory. One or more control lines 330 are coupled to control gates 332 to provide activation and deactivation signals.

In the example shown, Y-line portion 320 is associated with at least two subsets of X-lines. For example, Y-line portion ("Y00") 320a is arranged to couple via memory elements 340 to subset of X-lines ("X0") 302 and subset of X-lines ("X1") 304. Subset of X-lines ("X1") 304 includes X-line ("X10") 310a, X-line ("X11") 310b, and optional others not shown. Subset of X-lines ("X0") 302 includes X-line ("X00") 312a, X-line ("X01") 312b, and optional others not shown. Similarly, Y-line portion ("Y01") 320b is arranged to couple via memory elements 340 to subset of X-lines ("X0") 302 and subset of X-lines ("X1") 304. A representation 350 depicts a schematic for subset of X-lines 302 coupled via resistive memory elements to Y-line portions ("Y00") 320a and ("Y01") 320b. In some embodiments, one or more of control lines 330, control gates 332, and global bit line 336 are formed below an array including array portions 301, and, optionally, in a logical layer formed on a substrate.

In some embodiments, a memory element described in this figure or any figure herein can be implemented as a resistive memory element 390, which includes a structure 394 implementing an electrolytic insulator ("E1") and a structure 399 based on a conductive oxide material, such as a conductive metal oxide-based ("CMO-based") material, for example. Memory element 390 further can include two terminals (not shown). In various embodiments, the structure 399 can include one or more layers of a conductive oxide material, such as one or more layers of a conductive metal oxide-based ("CMO-based") material, for example. In various embodiments, structure 399 can include but is not limited to a material selected from one or more the following: $PrCaMnO_x$ (PCMO), $LaNiO_x$ (LNO), $SrRuO_x$ (SRO), $LaSrCrO_x$ (LSCrO), $LaCaMnO_x$ (LCMO), $LaSrCaMnO_x$ (LSCMO), $LaSrMnO_x$ (LSMO), $LaSrCoO_x$ (LSCoO), and $LaSrFeO_x$ (LSFeO), where x is nominally 3 for perovskites. In various embodiments, electrolytic insulator 394 can include but is not limited to a material for implementing a tunnel barrier layer, the material being selected from one or more of the following: rare earth oxides, rare earth metal oxides, yttria-stabilized zirconium (YSZ), zirconia ($ZrO_x$), yttrium oxide ($YO_x$), erbium oxide ($ErO_x$), gadolinium oxide ($GdO_x$), lanthanum aluminum oxide ($LaAlO_x$), and hafnium oxide ($HfO_x$), and equivalent materials. Typically, the electrolytic insulator 904 comprises a thin film layer having a thickness of approximately less than 50 Å (e.g., in a range from about 10 Å to about 35 Å).

Figure 4A:
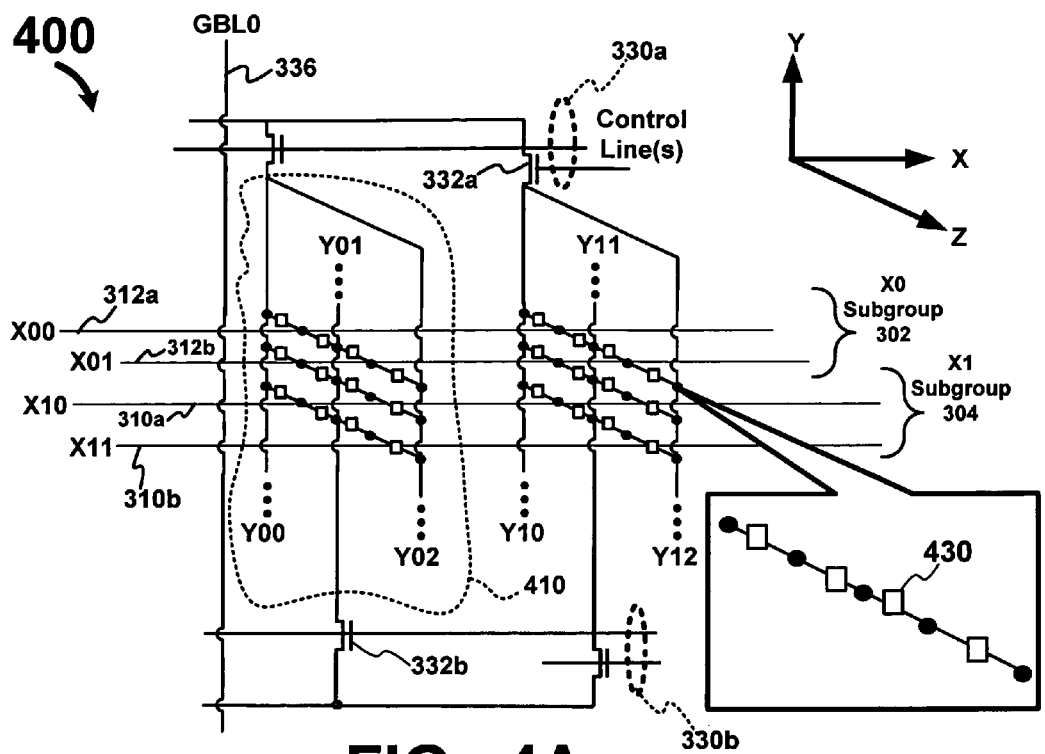
FIGS. 4A and 4B depict perspective views of a memory array architecture including sub-arrays based on bit line portions, according to various embodiments of the invention.
Figure 4B:
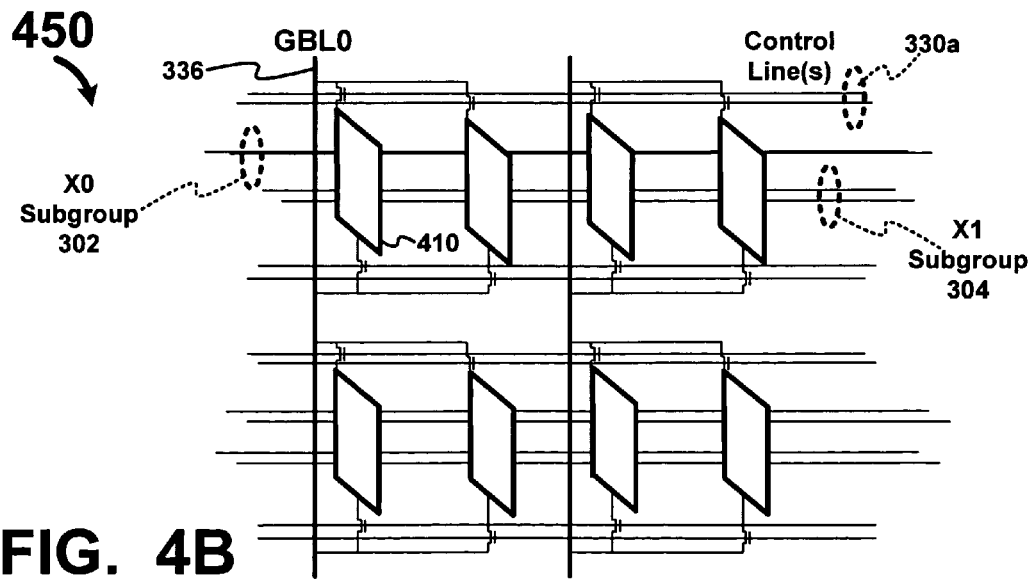

FIGS. 4A and 4B illustrate perspective views of a memory array architecture including sub-arrays based on bit line portions, according to various embodiments of the invention. Diagram 400 of FIG. 4A depicts word line subset ("X0 Subgroup") 302 and word line subset ("X1 Subgroup") 304 of FIG. 3. Word line subset 302 includes X-line ("X00") 312a and X-line ("X01") 312b formed below X-line ("X10") 310a and X-line ("X11") 310b of word line subset 304. In particular, word line subset 302 is formed below word line subset 304 relative to a distance along the Z-axis with respect to a substrate in an X-Y plane. Further, control lines 330a are configured to gate even-numbered local bit lines (e.g., Y00, Y02, Y10, and Y12) via gates 332a onto global bit line 335, whereas control lines 330b are configured to gate odd-numbered local bit lines (e.g., Y01 and Y11) via gates 332b onto global bit line 335. As shown, a memory element 430 is disposed at the intersections of a Y-line portion and either an X-line 310 or X-line 312. Diagram 450 of FIG. 4B depicts a larger portion of an array including multiple instances of sub-array 410 of FIG. 4A. In the examples shown, sub-array 410 includes layers of memory stacked in relation to bit line portions formed perpendicular to the word lines.

Figure 5:
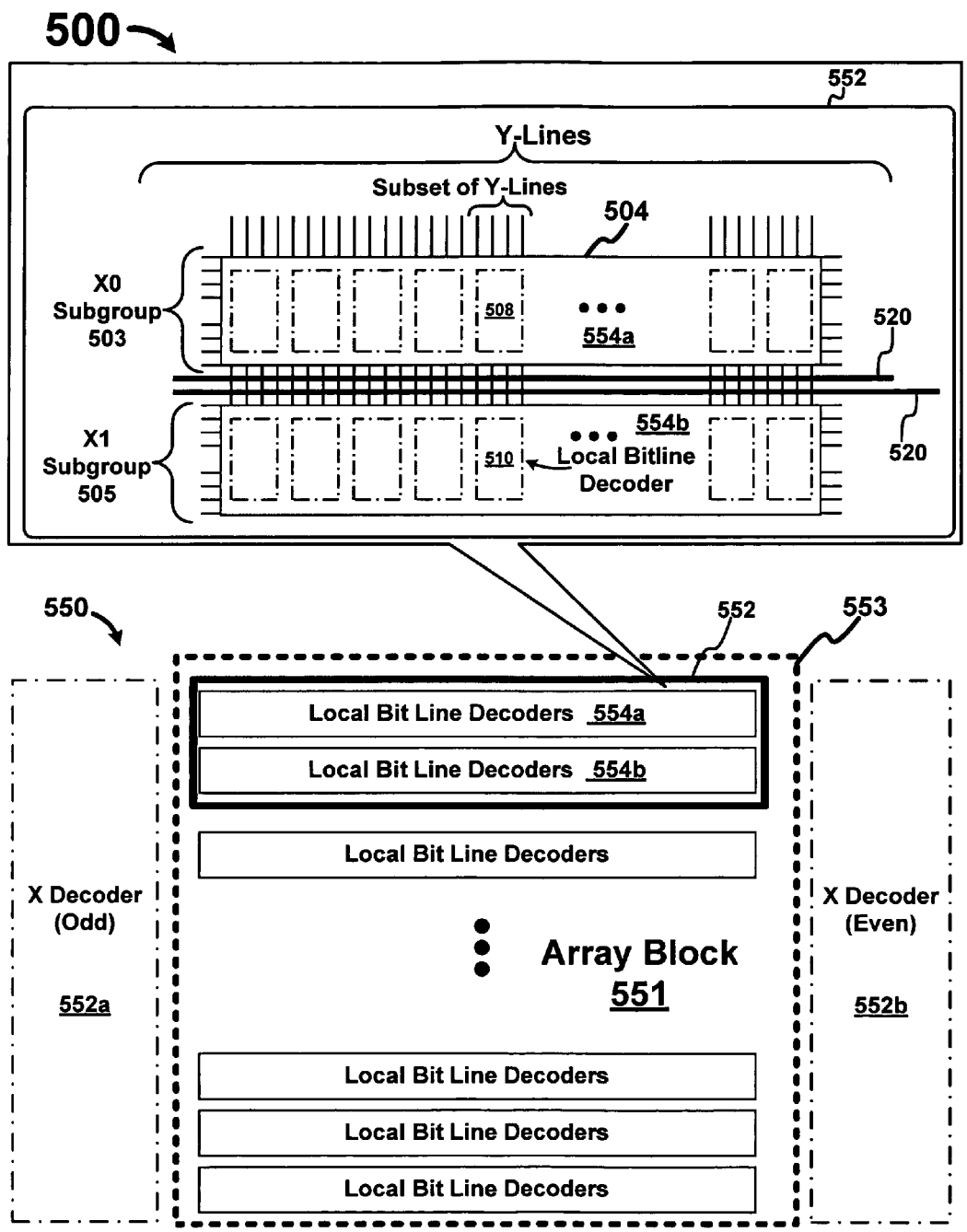
FIG. 5 depicts a diagram of an array structure, according to at least some embodiments of the invention.

FIG. 5 is a diagram depicting an array structure, according to at least some embodiments of the invention. In the example shown in diagram 500, FIG. 5 depicts a layout or plan view of array portion 552 includes array 554a and array 554b. Array 554a and array 554b include an X-line subgroup ("X0") 503 and an X-line subgroup ("X1") 505, respectively, each having a number of X-lines that span at least over a number of Y-lines. Further, array 554a and array 554b can be formed over local bit line decoders 508 and 510, respectively, to control bit line portions that constitute a subset of Y-lines, arrays 554a and 554b including one or more layers of memory. Or, local bit line decoders 508 and 510 can be formed within a periphery 504 (or boundary) of any of arrays 554a or 554b, according to some embodiments. In particular, local bit line decoders 508 and 510 can be configured to decode at least a portion of an address to access one or more memory elements in a subset of memory elements for a Y-line portion, and can be disposed under the subset of the X-lines. In some embodiments, local bit line decoders 508 and 510 can be configured to access one or more memory elements along an X-line substantially simultaneously to perform, for example, an erase or program operation on a group of memory elements (e.g., a byte erase operation). Or, local bit line decoders 508 and 510 can be configured to access a bit line portion from all of the global bit lines along an X-line substantially simultaneously to perform, for example, a page erase operation.

Control lines 520 are configured to convey control signals to activate or deactivate local pass gates. Diagram 550 depicts a periphery 553 of an array block 551 in which array portion 552 is disposed. Thus, local bit line ("BL") decoders 508 and 510 are disposed under arrays 554a and 554b as part of array block 551. In one embodiment, an X decoder 552a and an X decoder 552b are located beyond the array block footprint or periphery 553. In one embodiment, X-line subgroup ("X0") 503 and an X-line subgroup ("X1") 505 each includes 64 X-lines that span across multiple global bit lines, such as 4 k Y-lines portions (or 4 k local bit lines). Thus, the length of an X-line can include 4 k memory elements. The length of a bit line portion can include 128 memory elements per layer, and a length of a global bit line can be 16 k cell within 256 groups of bit line portions. In array block 551, there can be 16 k X-lines over the subsets of Y-lines.

Figure 6:
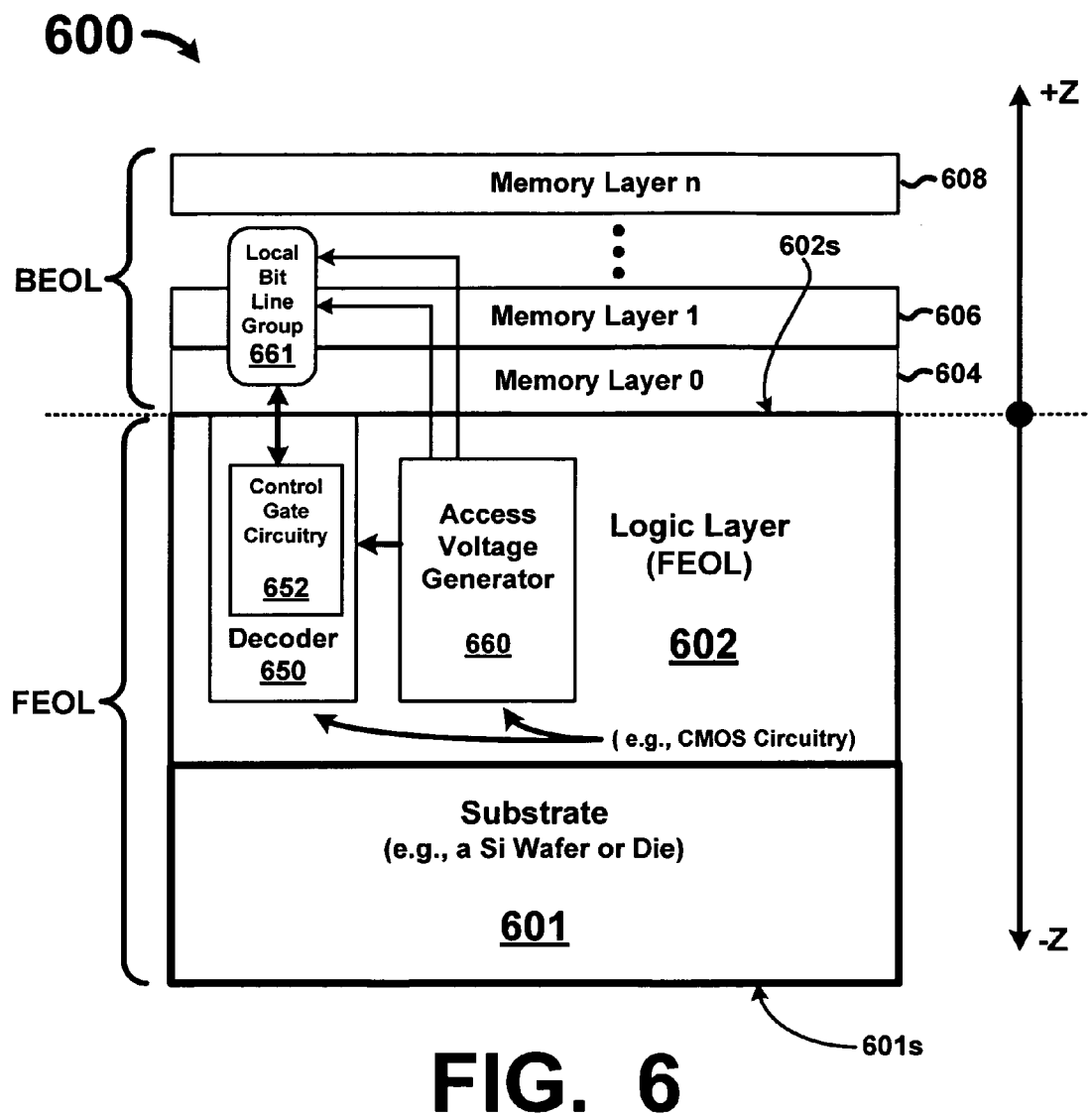
FIG. 6 depicts a cross-section view of an example of an integrated circuit implementing groups of local bit lines, according to one embodiment of the invention.

FIG. 6 depicts a cross-section view of an example of an integrated circuit implementing groups of local bit lines, according to one embodiment of the invention. Cross-section view 600 shows multiple memory layers (e.g., BEOL) being vertically disposed above and in contact with a logic layer 602 (e.g., FEOL), which can include logic circuitry (e.g., CMOS circuitry) for reading data from memory cells as well as programming and erasing logical values in memory elements. Logic layer 602 and its logic circuitry can be formed (e.g., fabricated FEOL using microelectronics fabrication processes) upon a semiconductor substrate 601 (e.g., a Silicon—Si wafer or die). The logic circuitry, for example, can include a decoder 650 having control gate circuitry 652 to control operation of pass gates formed in logic layer 602, the pass gates being operable to couple one of a group of bit line portions to a global bit line. Further, the logic circuitry can include an access voltage generator 660 to generate various select voltage signals and unselect voltage signals, as well as various activation and deactivation control signal magnitudes (e.g., including pre-charge voltage magnitudes). Multiple memory layers can include a first layer 604 that is on contact with the substrate 601, a second layer 606 and an "nth" layer 608 of third dimension memory that are vertically stacked over the first layer 604. The multiple memory layers (604-608) can be fabricated BEOL directly on top of the substrate 601 for the logic layer 602. The logic layer 602 can include an inter-layer interconnect structure (not shown) operative to electrically couple the active circuitry (e.g., 650, 652, 660) in the logic layer 602 with the one or more layers of BEOL memory using electrically conductive interconnect structures such as vias, throughs, contacts, plugs, and the like. The multiple layer(s) of BEOL memory can be fabricated (e.g., grown) directly on top of an upper surface 602s of the logic layer 602 or its inter-layer interconnect structure. In various embodiments, a group 661 of local bit lines can be implemented anywhere in memory layer 602 to 608. While group of local bit lines 661 can reside in a single layer, the group of local bit lines 661 can also extend through multiple layers of memory. Cross-section view 600 can depict a portion of a semiconductor substrate (e.g., a Si wafer) or a die that has be singulated (e.g., precision cut or sawn) from the semiconductor substrate or wafer. Subsequently, the die (e.g., a bottom surface 601s of substrate 601) can be mounted and electrically coupled with pins or pads in a suitable IC package (not shown) to form a packaged IC. that can be mounted to a PC board.

In some embodiments, the logic circuitry of logic layer 602 is formed using CMOS process technologies, including low voltage CMOS process technologies. In some embodiments, access voltage generator 660 is configured to select a first access voltage to apply to an X-line and a second access voltage to apply to a Y-line to generate a potential difference across a memory element that is less than a breakdown voltage of a Y-line MOS gate. In some embodiments, the potential difference between the first access voltage and the second access voltage is less than 4 volts. In various embodiments, the dimensions of the memory elements can scale with dimensions and/or operational characteristics of CMOS devices formed using CMOS process technologies. For example, logic layer 602 can include scaled Y-line MOS gates that are coupled between a Y-line and a group of Y-line portions (or local bit lines), with the scaled Y-line MOS gates having scaled dimensions of Y-line MOS gates. In at least some cases, the dimensions of the MOS gates scale commensurately with dimensions of the memory elements that constitute a reduced array size as a cross-point memory array. Further, the scaling of the Y-lines MOS gates to form the scaled Y-line MOS gates facilitates the formation of the gates under the cross-point memory array having the reduced array size.

Figure 7A:
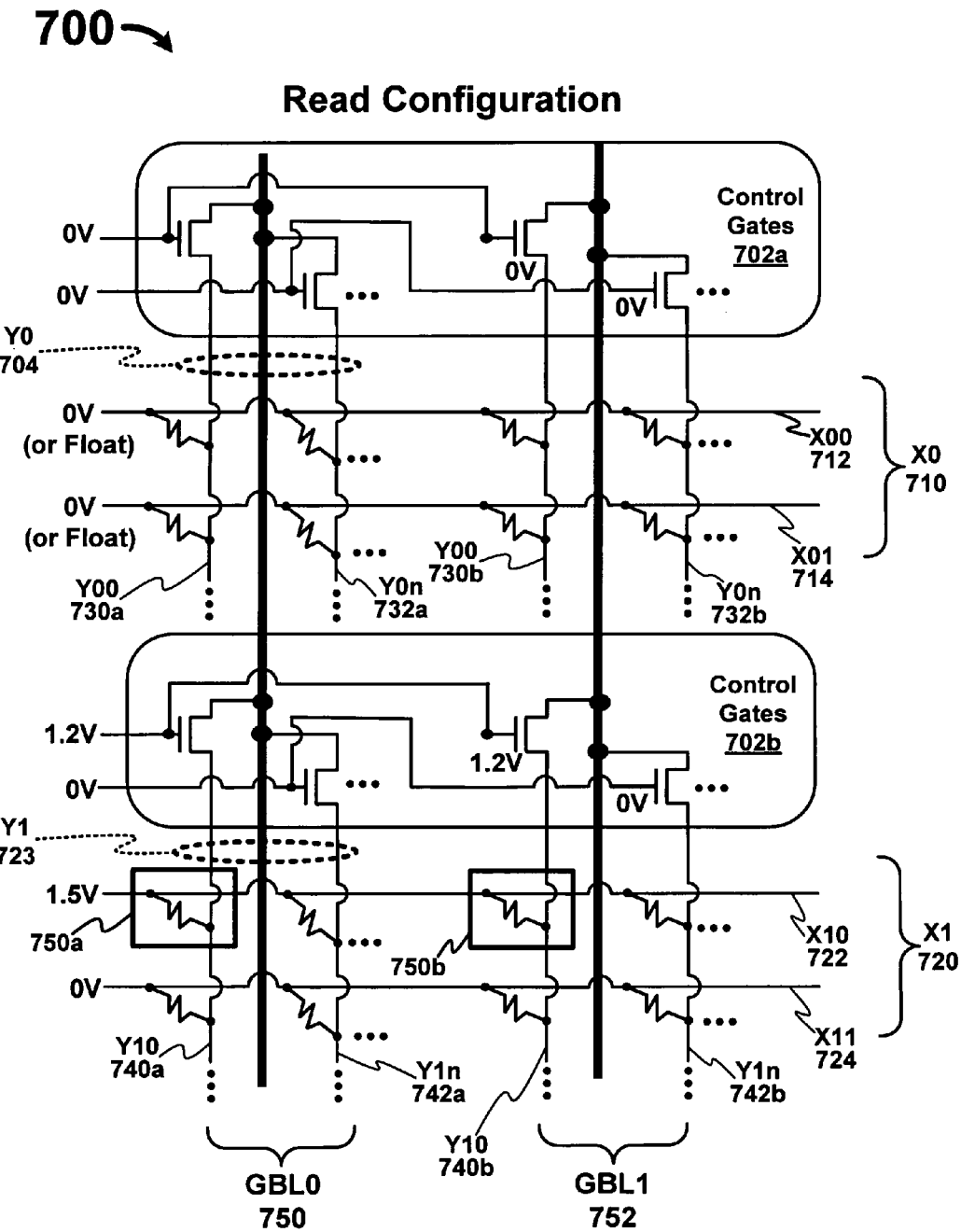
FIGS. 7A and 7B are diagrams depicting an array structure and the timing during a read operation, according to some embodiments.
Figure 7B:
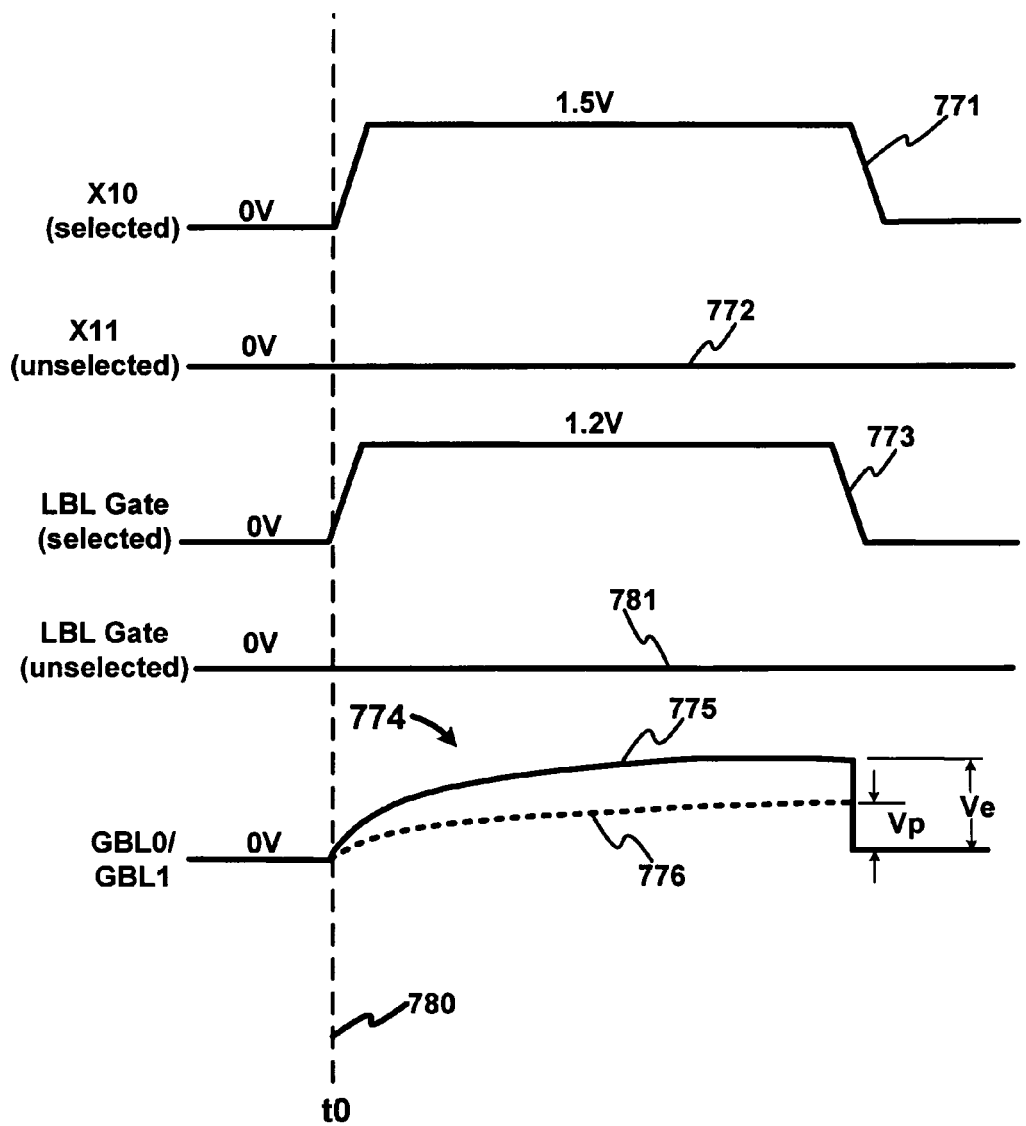

FIGS. 7A and 7B are diagrams illustrating an array structure and the timing during a read operation, according to some embodiments. Diagram 700 depicts an array portion in a read configuration, the array portion including control gates 702a for a subset of X-lines ("X0") 710 and groups of bit lines portions, such as a first group ("Y0") 704 that includes bit line portions from ("Y00") 730a to ("Y0n") 732a and a second group including bit line portions from ("Y00") 730b to ("Y0n") 732b. Subset of X-lines ("X0") 710 includes X-line ("X00") 712 and X-line ("X01") 714. Further, the array portion includes control gates 702b for a subset of X-lines ("X1") 720 and groups of bit lines portions, such as a first group ("Y1") 723 that includes bit line portions from ("Y10") 740a to ("Y1n") 742a and a second group including bit line portions from ("Y10") 740b to ("Y1n") 742b. Subset of X-lines ("X1") 720 includes X-line ("X10") 722 and X-line ("X11") 724. Note that groups 704 and 723 of bit line portions are associated with global bit line ("GBL0") 750, and the other groups of bit line portions are associated with global bit line ("GBL1") 752. In the example shown, memory elements 750a and 750b are selected for access to read values therefrom.

FIG. 7B is a read timing diagram for FIG. 7A, according to some embodiments. Diagram 770 depicts select voltages and unselect voltages to be applied to certain X-lines and activation and deactivation signals for application to local bit line ("LBL") pass gates. As shown, X-lines 722 and 724 are initialized to 0 volts, as well as control gates 702b associated with memory elements 750a and 750b. At time zero (10") 780, a select voltage signal 771 of 1.5 volts is applied to X-line ("X10") 722 to apply read voltages to terminals for each memory elements 750a and 750b. Unselected word line or X-line 724 remains at 0 volts, as shown by a non-selected voltage signal 772. A deactivation signal 781 remains applied (e.g., at 0 volts) to other pass gates that are not coupled to bit line portions 740a and 740b. An activation signal 773 of 1.2 volts is applied to control gates 702b that are coupled to bit line portions 740a and 740b, thereby coupling memory elements 750a and 750b to global bit line 750 and the global bit line 752, respectively. A voltage 774 is read from each memory element and can take the shape of waveform 775, if a memory element is erased, or the shape of waveform 776, if the memory element is programmed. Note that unselected X-lines in subset of X-lines ("X0") 710 are configured to float (e.g., as a non-select voltage signal represents a disconnected or floating state) as none of X-line ("X00") 712 and X-line ("X01") 714 are selected.

Figure 8A:
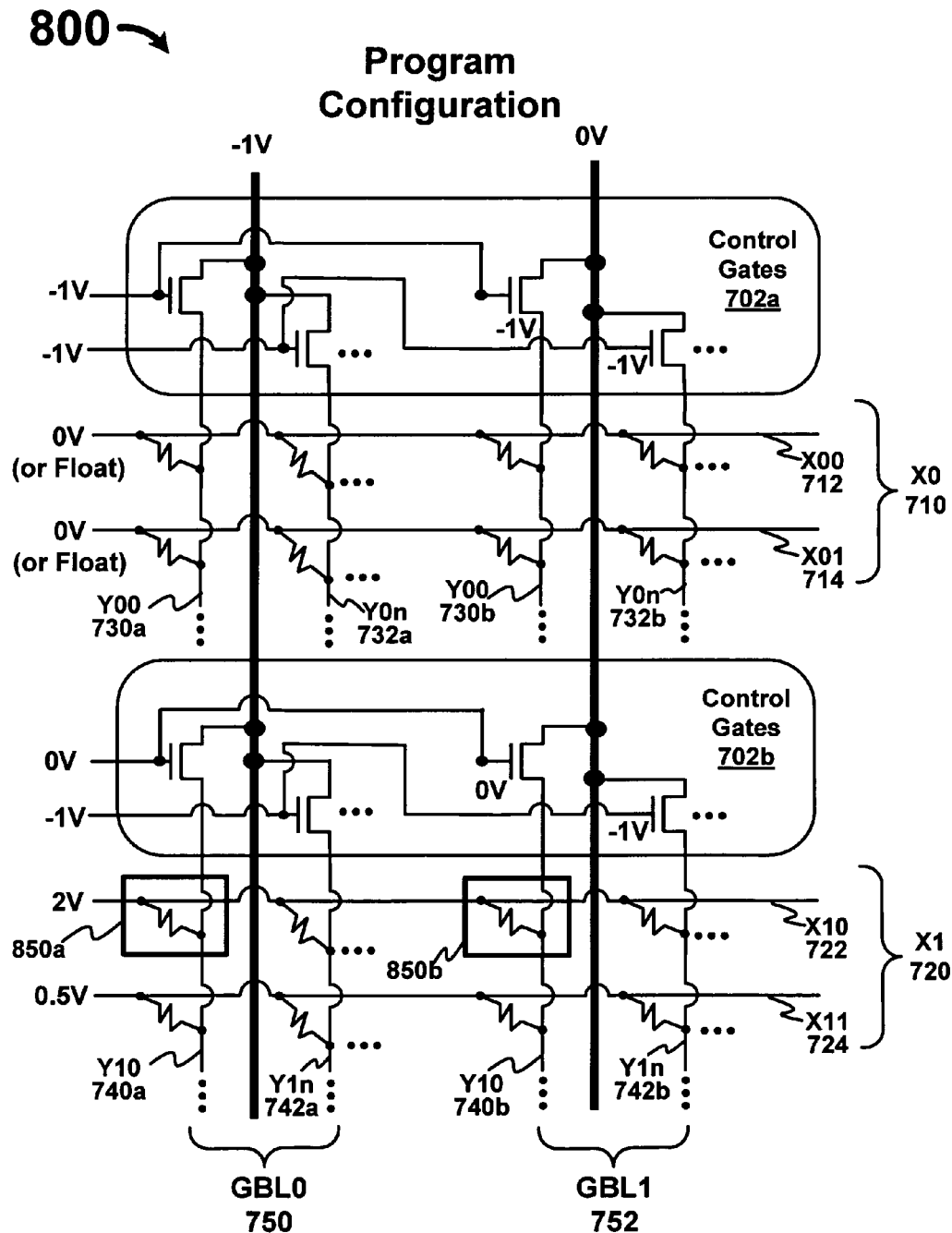
FIGS. 8A and 8B are diagrams depicting an array structure and the timing during a program operation, according to some embodiments.
Figure 8B:
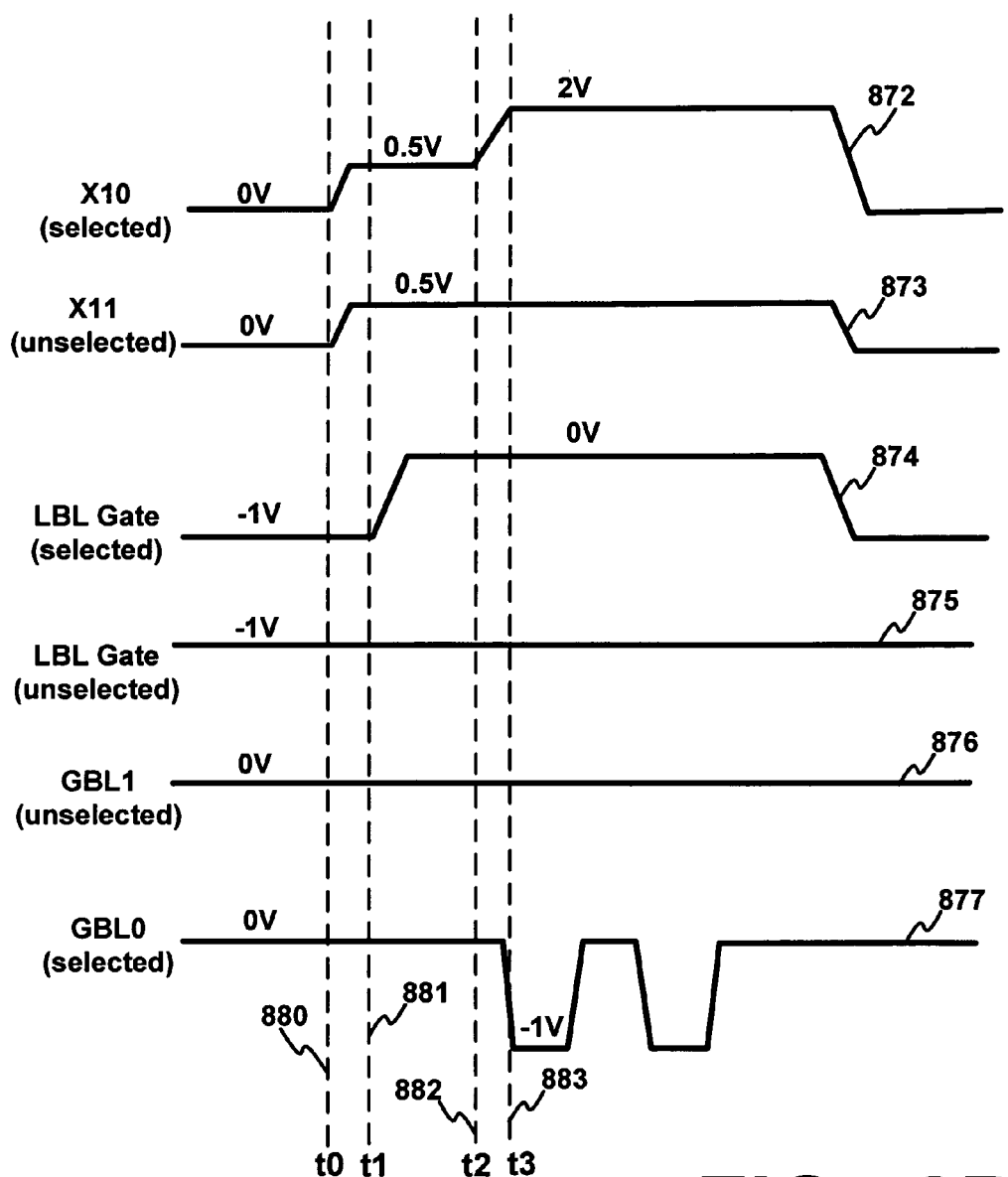

FIGS. 8A and 8B are diagrams illustrating an array structure and the timing during a program operation, according to some embodiments. Diagram 800 depicts an array portion in a program configuration, the array portion including elements having equivalent function and/or structure to similarly-named elements in FIGS. 7A and 7B. In this example, memory elements 850a and 850b are selected memory elements for programming. FIG. 8B is a program timing diagram for FIG. 8A, according to some embodiments. Diagram 870 depicts select voltages and unselect voltages to be applied to certain X-lines and activation and deactivation signals for application to local bit line ("LBL") pass gates. As shown, X-lines 722 and 724 are initialized to 0 volts, global bit line 750 and global bit line 752 are initialized to 0 volts, and control gates 702b associated with memory elements 850a and 850b are initialized to have a gate voltage of −1 volt. At time ("t0") 880, a pre-charge signal 872 of 0.5 volts and a pre-charge signal 873 of 0.5 volts are applied to X-line 722 and X-line 724. At time ("t1") 881, an activation signal 874 of 0 volts is applied to the control gates 702b coupled to bit line portions 740a and 740b, whereas a deactivation signal 875 of −1 volt remains applied to pass gates not coupled to bit line portions 740a and 740b. At time ("t2") 882, a select voltage signal 872 of 2 volts is applied to X-line 722, whereas a non-select voltage signal 873 of 0.5 volts remains applied to X-line 724. At time (13") 883, a non-select signal 876 of 0 volts remains applied to global bit line 752, and a select voltage signal 877 of −1 volt is applied to global bit line 750.

Figure 9A:
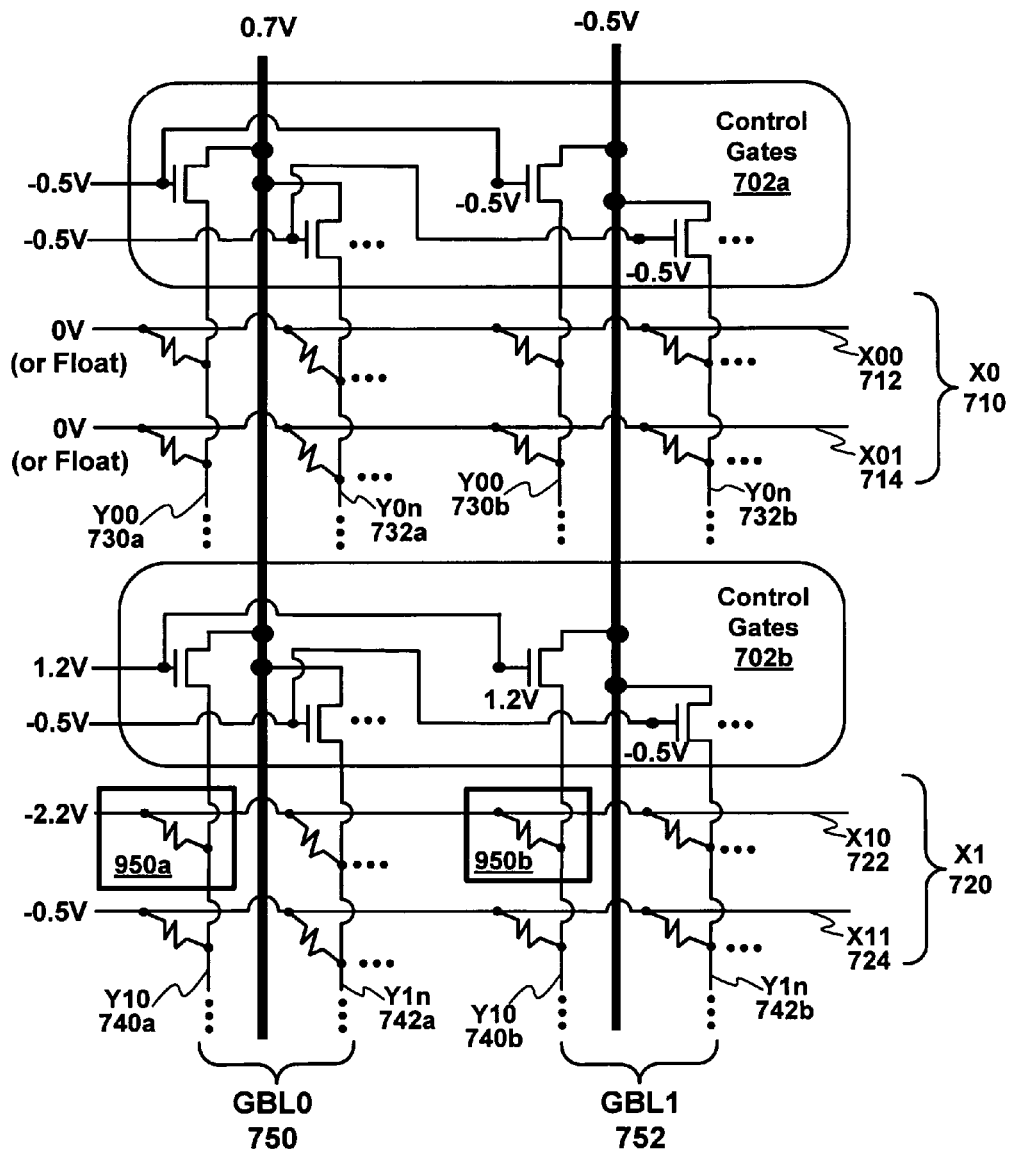
FIGS. 9A and 9B are diagrams depicting an array structure and the timing during an erase operation, according to some embodiments.
Figure 9B:
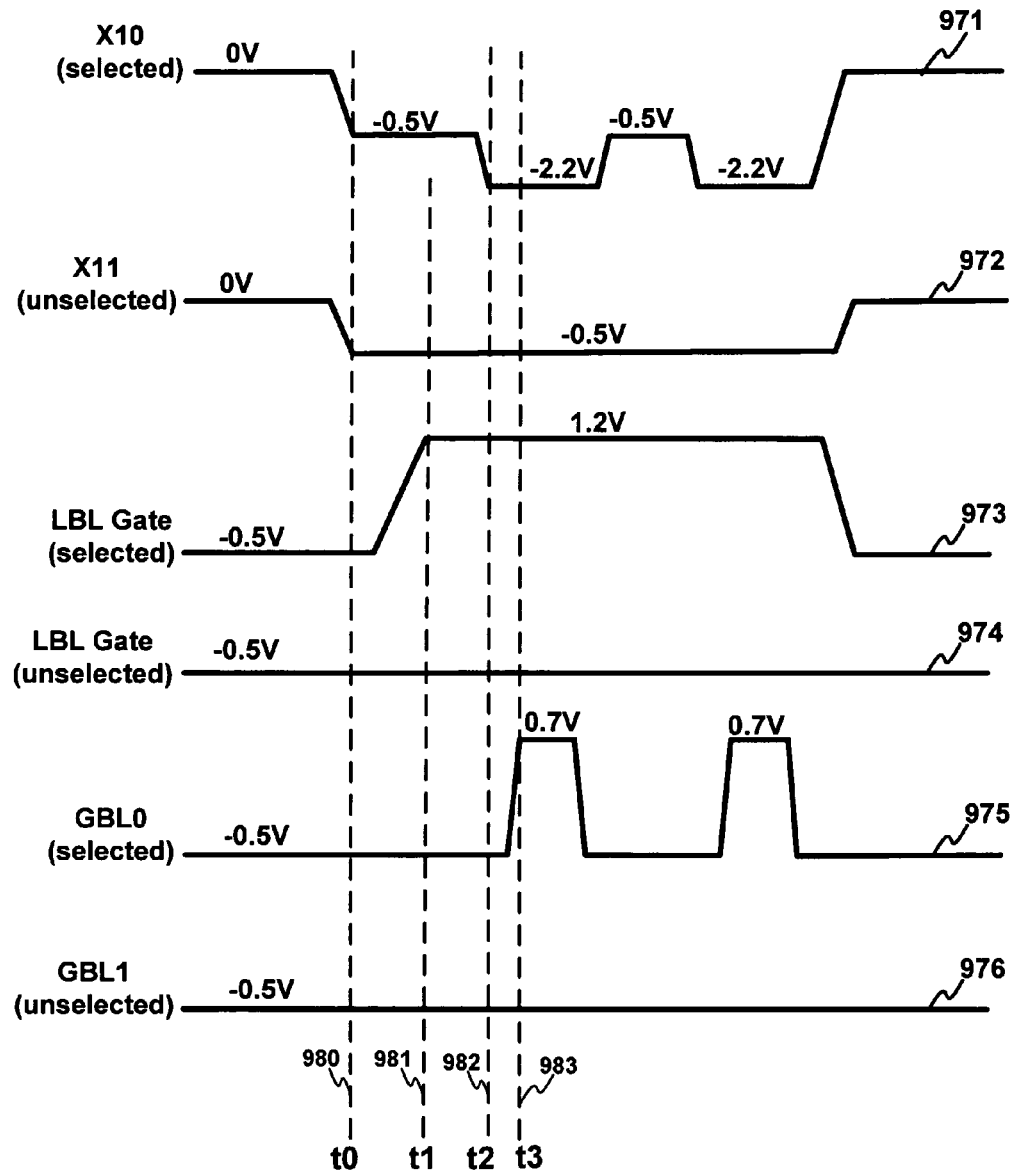

FIGS. 9A and 9B are diagrams illustrating an array structure and the timing during an erase operation, according to some embodiments. Diagram 900 depicts an array portion in an erase configuration, the array portion including elements having equivalent function and/or structure to similarly-named elements in FIGS. 7A and 7B. In this example, memory elements 950a and 950b are selected memory elements for erasing (e.g., such as in a byte erase operation). FIG. 9B is an erase timing diagram for FIG. 9A, according to some embodiments. Diagram 970 depicts select voltages and unselect voltages to be applied to certain X-lines and activation and deactivation signals for application to local bit line ("LBL") pass gates. As shown, X-lines 722 and 724 are initialized to 0 volts, global bit line 750 and global bit line 752 are initialized to −0.5 volts, and control gates 702b associated with memory elements 950a and 950b are initialized to −0.5 volts. At time (10") 980, a pre-charge signal 971 of −0.5 volts and a pre-charge signal 972 of −0.5 volts are applied to X-line 722 and X-line 724. At time ("t1") 981, an activation signal 973 of 1.2 volts is applied to the control gates 702b coupled to bit line portions 740a and 740b, whereas a deactivation signal 974 of −0.5 volts remains applied to pass gates not coupled to bit line portions 740a and 740b. At time ("t2") 982, a select voltage signal 971 of −2.2 volts is applied to X-line 722, whereas a non-select voltage signal 972 of −0.5 volts remains applied to X-line 724. At time ("t3") 983, a non-select signal 976 of −0.5 volts remains applied to global bit line 752, and a select voltage signal 975 of 0.7 volts is applied to global bit line 750. In some embodiments the byte erase voltages applied on the X and Y lines may be applied more than once, as shown in FIG. 9B, where 2 byte erase pulses are shown.

Figure 10A:
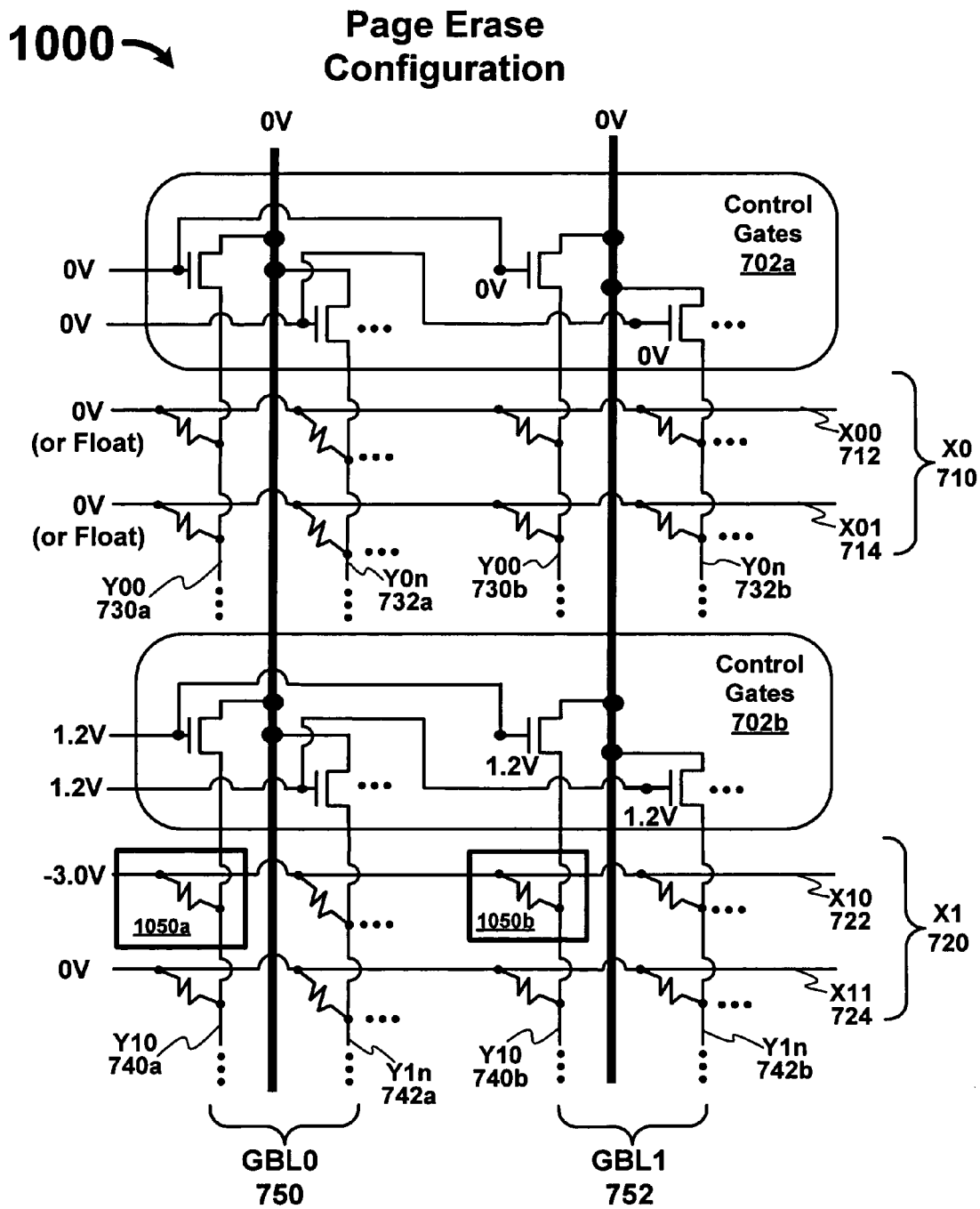
FIGS. 10A and 10B are diagrams depicting an array structure and the timing during a page erase operation, according to some embodiments.
Figure 10B:
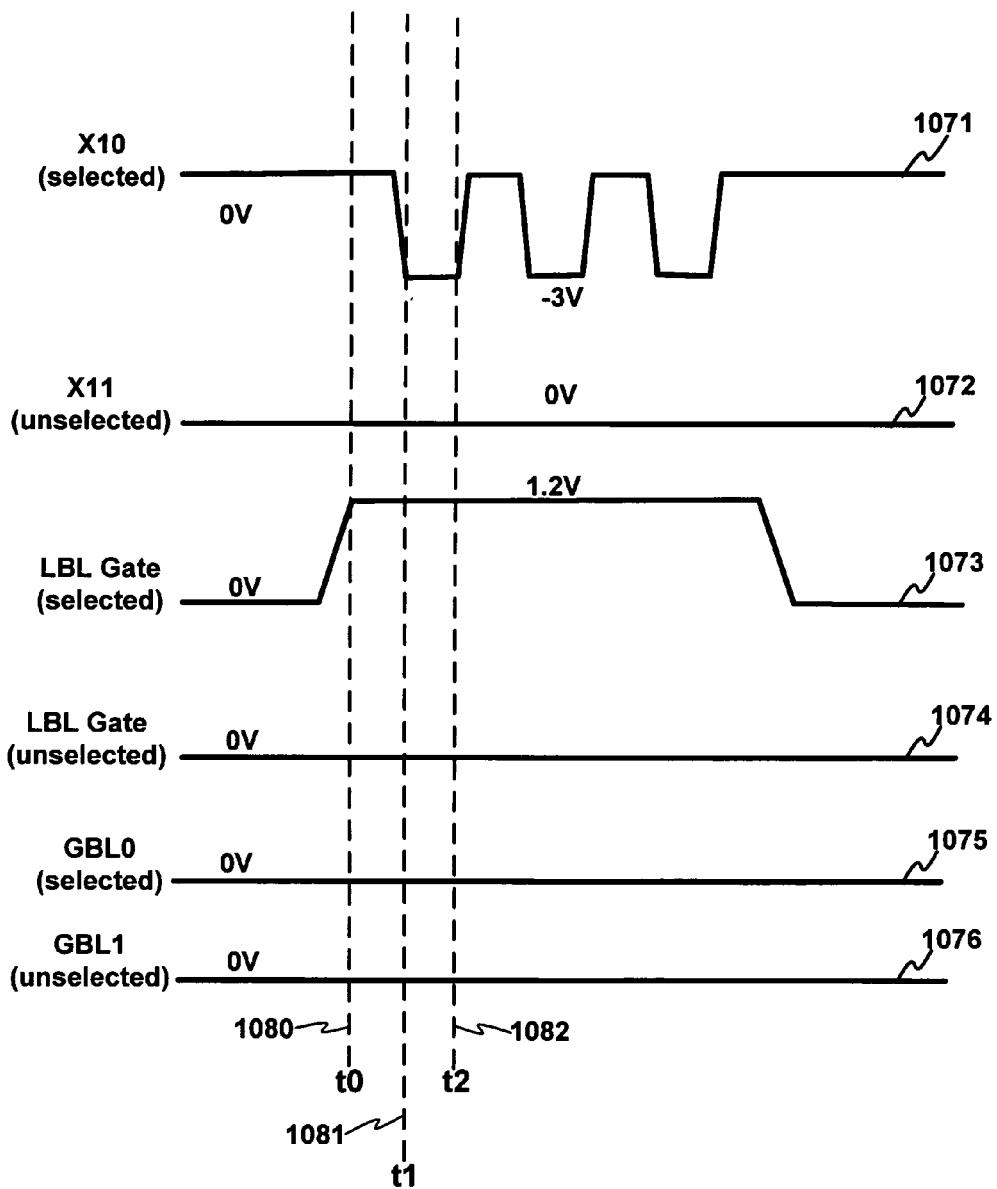

FIGS. 10A and 10B are diagrams illustrating an array structure and the timing during a page erase operation, according to some embodiments. Diagram 1000 depicts an array portion in a page erase configuration, the array portion including elements having equivalent function and/or structure to similarly-named elements in FIGS. 7A and 7B. In this example, memory elements 1050a and 1050b are selected memory elements for erasing (e.g., such as in a page erase operation). FIG. 10B is a page erase timing diagram for FIG. 10A, according to some embodiments. Diagram 1070 depicts select voltages and unselect voltages to be applied to certain X-lines and activation and deactivation signals for application to local bit line ("LBL") pass gates. As shown, X-lines 722 and 724 are initialized to 0 volts, global bit line 750 and global bit line 752 are initialized to 0 volts, and control gates 702b associated with memory elements 1050a and 1050b are initialized to 0 volts. At time (10") 1080, an activation signal 1073 of 1.2 volts is applied to control gates 702b that are coupled to bit line portions 740a and 740b, whereas a deactivation signal 1074 of 0 volts remains applied to pass gates not coupled to bit line portions 740a and 740b. At time ("t1") 1081, a select voltage signal 1071 of −3.0 volts is applied to X-line 722, whereas a non-select voltage signal 1072 of 0 volts remains applied to X-line 724. Select voltage signals 1076 and 1075 of 0 volts remain applied to global bit line 752 and global bit line 750, respectively, to erase data store in memory elements 1050a and 1050b.

The various embodiments of the invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes can be performed in an arbitrary order, unless otherwise provided in the claims.

The foregoing description, for purposes of explanation, uses specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. A non-volatile memory device, comprising:
    a plurality of pass gates;
    an array including
        a plurality of vertically stacked memory layers,
        resistive memory elements,
        word lines, and
        subsets including a plurality of local bit lines, each local bit line comprised of electrically coupled horizontal and vertical segments, the vertical segment electrically coupled with a different one of the plurality of pass gates,
        each memory element having exactly two terminals with one terminal electrically coupled with only one of the word lines and another terminal electrically coupled with the horizontal segment of only one of the plurality of local bit lines in the subset the memory element is positioned in, and the horizontal segment of each local bit line is electrically coupled only with memory elements positioned in a subset of the plurality of vertically stacked memory layers,
        each memory element is electrically in series with its respective word line and local bit line, the subsets of local bit lines configured to electrically couple with global bit lines via the plurality of pass gates; and
    a plurality of local bit line decoders configured to turn on a subset of the pass gates to electrically couple a subset of resistive memory elements with a group of the global bit lines,
    wherein the plurality of pass gates are disposed in a different plane of a semiconductor die than the subset of resistive memory elements.

2. The non-volatile memory device of claim 1, wherein the pass gates are positioned under the array.

3. The non-volatile memory device of claim 1, wherein the plurality of the local bit line decoders are positioned under the array.

4. The non-volatile memory device of claim 1, wherein each memory element in the subset of resistive memory elements is configured to provide an amount of current to a global bit line in the group of the global bit lines to offset another amount of current drawn from the global bit line into unselected resistive memory elements in the subset of resistive memory elements.

5. The non-volatile memory device of claim 4, wherein the amount of current less the another amount of current constitutes a read current on the global bit line.

6. The non-volatile memory device of claim 1, wherein at least one of the subsets of local bit lines comprises
    a pass gate,
    a local bit line,
    a resistive memory element coupled to the local bit line and configured to apply in a selected state an access current representative of a resistive state via the pass gate to establish a voltage on a global bit line that is not less than a target voltage, and
    other resistive memory elements coupled to the local bit line and configured to conduct in an unselected state a leakage current from the global bit line,
    wherein the other resistive memory elements include a number of unselected resistive memory elements that collectively conduct an amount of the leakage current that maintains the voltage.

7. The non-volatile memory device of claim 1 and further comprising:
    an access voltage generator configured to apply a first access voltage to a selected word line and a second access voltage to the group of the global bit lines to apply a potential difference across selected resistive memory elements in the subset of resistive memory elements,
    wherein the potential difference is sufficient to write data into the selected resistive memory elements.

8. The non-volatile memory device of claim 7, wherein the potential difference is a positive potential difference from one of the global bit lines to the selected word line, the positive potential difference being configured to erase the selected resistive memory elements.

9. The non-volatile memory device of claim 7, wherein the potential difference is a negative potential difference from one of the global bit lines to the selected word line, the negative potential difference being configured to program the selected resistive memory elements.

10. The non-volatile memory device of claim 9, wherein the group of the global bit lines provides an amount of bits associated with a page erase operation.

11. The non-volatile memory device of claim 9, wherein the group of the global bit lines provides an amount of bits associated with a byte erase operation.

12. The non-volatile memory device of claim 7, wherein the access voltage controller is further configured to pre-charge the selected word line and unselected word lines prior to applying the potential difference.

13. The non-volatile memory device of claim 12 and further comprising:
    control lines disposed under the array, each of the control lines being configured to transmit a pass gate voltage generated by the access voltage generator to one or more pass gates in the subset of the pass gates,
    wherein the access voltage generator is further configured to generate a gate voltage for the one or more pass gates during an interval after the selected word line and the unselected word lines are pre-charged and prior to applying the potential difference.

14. The non-volatile memory device of claim 1, wherein electrically in series with the two terminals of each memory element, each memory element includes only
    a tunnel barrier layer, and
    a structure including one or more layers of a conductive oxide material in direct contact with the tunnel barrier layer.

15. The non-volatile memory device of claim 14, wherein the structure further comprises one or more materials selected from the group consisting of a perovskite, $PrCaMnO_x$, LaN- $iO_x$, $SrRuO_x$, $LaSrCrO_x$, $LaCaMnO_x$, $LaSrCaMnO_x$, $LaSrMnO_x$, $LaSrCoO_x$, and $LaSrFeO_x$.

16. The non-volatile memory device of claim 14, wherein the tunnel barrier layer comprises a material selected from the group consisting of rare earth oxides, rare earth metal oxides, yttria-stabilized zirconium, zirconia, yttrium oxide, erbium oxide, gadolinium oxide, lanthanum aluminum oxide, and hafnium oxide.

17. The non-volatile memory device of claim 1, wherein each horizontal segment in each memory layer has terminals of more than two memory elements electrically coupled with the horizontal segment.

18. The non-volatile memory device of claim 1, wherein horizontal segments is some memory layers are electrically coupled with the terminals of twice as many memory elements than horizontal segments in other memory layers.

19. The non-volatile memory device of claim 1, wherein each local bit line comprises a plurality of horizontal segments that are electrically coupled with a plurality of vertical segments.

20. The non-volatile memory device of claim 19, wherein some vertical segments are electrically coupled with fewer horizontal segments than other vertical segments.

21. The non-volatile memory device of claim 1, wherein some horizontal segments are electrically coupled with fewer terminals of memory elements than other horizontal segments.

22. The non-volatile memory device of claim 1, wherein each memory element includes a non-linear resistivity that is a function of a potential difference applied across its two terminals.

23. The non-volatile memory device of claim 1, wherein each memory element includes a non-linear current characteristic that is a function of a potential difference applied across its two terminals.

* * * * *